US010025887B1

(12) United States Patent
Santarone et al.

(10) Patent No.: US 10,025,887 B1
(45) Date of Patent: Jul. 17, 2018

(54) BUILDING MODEL WITH VIRTUAL CAPTURE OF AS BUILT FEATURES AND OBJECTIVE PERFORMANCE TRACKING

(71) Applicant: Stellar VDC Residential, LLC, Jacksonville, FL (US)

(72) Inventors: Michael S. Santarone, Jacksonville, FL (US); Jason E. Duff, Jacksonville, FL (US)

(73) Assignee: STELLAR VDC RESIDENTIAL, LLC, Jacksonville, FL (US)

( * ) Notice: Subject to any disclaimer, the term of this patent is extended or adjusted under 35 U.S.C. 154(b) by 0 days.

(21) Appl. No.: 15/716,133

(22) Filed: Sep. 26, 2017

Related U.S. Application Data

(60) Provisional application No. 62/531,955, filed on Jul. 13, 2017, provisional application No. 62/531,975, filed on Jul. 13, 2017, provisional application No. 62/462,347, filed on Feb. 22, 2017.

(51) Int. Cl.
| | |
|---|---|
| *G01S 5/00* | (2006.01) |
| *G01S 5/14* | (2006.01) |
| *G06F 17/50* | (2006.01) |
| *G01S 19/07* | (2010.01) |
| *G06Q 50/16* | (2012.01) |
| *G01S 19/13* | (2010.01) |
| *G06N 5/04* | (2006.01) |
| *G01S 5/02* | (2010.01) |

(52) U.S. Cl.
CPC ........ *G06F 17/5004* (2013.01); *G01S 5/0257* (2013.01); *G01S 5/14* (2013.01); *G01S 19/07* (2013.01); *G01S 19/13* (2013.01); *G06N 5/04* (2013.01); *G06Q 50/165* (2013.01)

(58) Field of Classification Search
CPC ........................... G01S 5/14; G05B 2219/2642
See application file for complete search history.

(56) References Cited

U.S. PATENT DOCUMENTS

| | | | | |
|---|---|---|---|---|
| 6,006,021 | A * | 12/1999 | Tognazzini | G01S 5/0009 342/179 |
| 2002/0095269 | A1* | 7/2002 | Natalini | H04L 12/2803 702/188 |
| 2005/0275525 | A1 | 12/2005 | Ahmed | |
| 2012/0087212 | A1* | 4/2012 | Vartanian | G01S 15/08 367/118 |
| 2012/0214507 | A1 | 8/2012 | Vartanian et al. | |

(Continued)

FOREIGN PATENT DOCUMENTS

WO 2016/130571 A1 8/2016

OTHER PUBLICATIONS

Kyle, Property Management, Dearborn Real Estate, 2000—Business & Economics, pp. 40-41.*

(Continued)

*Primary Examiner* — Michael Dalbo
(74) *Attorney, Agent, or Firm* — Joesph Kincart, Esq.; Rogers Towers, P.A.

(57) ABSTRACT

The present invention relates to improved methods and apparatus for modeling a Stated Objective and calculating future Performance of a residential structure. The Stated Objective is based upon an Augmented Virtual Model of a residential structure and property. Aspects of Calculated Performance may be aggregated across multiple properties.

20 Claims, 18 Drawing Sheets

(56) References Cited

U.S. PATENT DOCUMENTS

| | | | |
|---|---|---|---|
| 2012/0296610 A1* | 11/2012 | Hailemariam | G06T 19/00 |
| | | | 703/1 |
| 2013/0297555 A1 | 11/2013 | Fadell et al. | |
| 2014/0156455 A1* | 6/2014 | Atwood | G06Q 30/0607 |
| | | | 705/26.25 |
| 2014/0266755 A1 | 9/2014 | Arensmeier et al. | |
| 2015/0327010 A1 | 11/2015 | Gottschalk et al. | |
| 2016/0026253 A1 | 1/2016 | Bradski et al. | |
| 2017/0055126 A1* | 2/2017 | O'Keeffe | H04W 4/023 |
| 2017/0234962 A1* | 8/2017 | Yang | G01S 5/0252 |
| | | | 342/465 |

OTHER PUBLICATIONS

International Search Report and Written Opinion dated May 14, 2018 issued in connection with corresponding International Application No. PCT/US2018/019154 (10 pages total).

Wang et al. Performance Evaluation of Automatically Generated BIM from Laser Scanner Data for Sustainability Analyses. 2015. [retrieved on Apr. 23, 2018]. Retrieved from the Internet: <URL: https:1/ac.els-cdn.com/S1877705815021864/1-s2.0-S 1877705815021864-main.pdf? tid=0f518636-8a50-4672-82cf-ccf35fe6fdc5&acdnat=1524510439 _7 cb 183d4ec908d 1 ce96f299 3e0e2t731>. (8 pages total).

Hu. Wi-Fi Based Indoor Positioning System Using Smartphones. Nov. 2013. [retrieved on Apr. 23, 2018]. Retrieved from the Internet: <URL:https://researchbank.rmit.edu.au/eserv/rmit: 1607 49/Hu .pdf> (91 pages total).

International Search Report and Written Opinion dated May 7, 2018 issued in connection with corresponding International Application No. PCT/US2018/019185 (7 pages total).

* cited by examiner

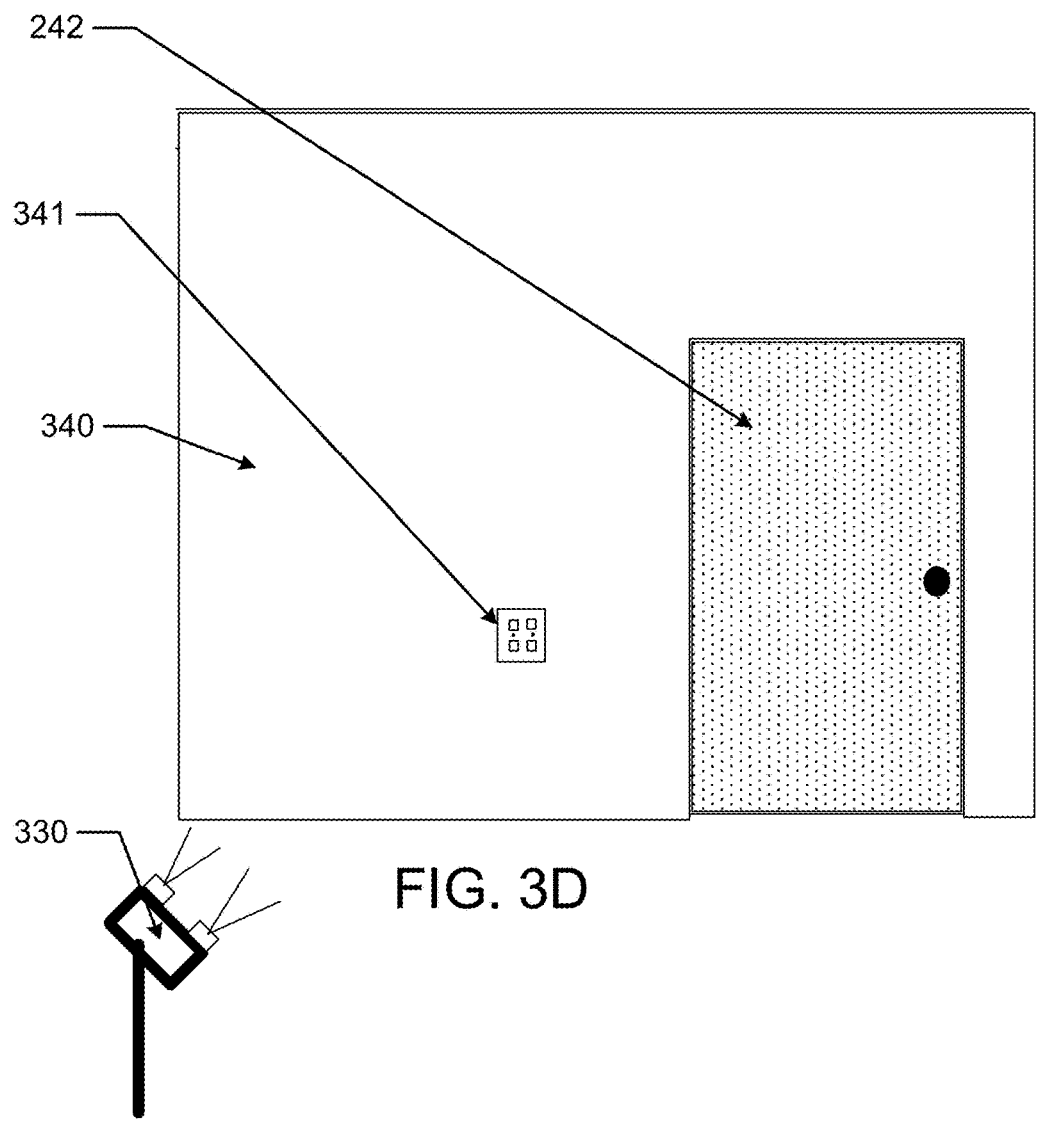

BUILDING MODEL WITH VIRTUAL CAPTURE OF AS BUILT FEATURES AND OBJECTIVE PERFORMANCE TRACKING

CROSS REFERENCE TO RELATED APPLICATIONS

The present application claims priority to Provisional Patent Application Ser. No. 62/462,347, filed Feb. 22, 2017 and entitled VIRTUAL DESIGN, MODELLING AND OPERATIONAL MONITORING SYSTEM: and to Provisional Patent Application Ser. No. 62/531,955, filed Jul. 13, 2017 and entitled BUILDING MODELING WITH VIRTUAL CAPTURE OF AS BUILT FEATURES; and to Provisional Patent Application Ser. No. 62/531,975 filed Jul. 13, 2017 and entitled BUILDING MAINTENANCE AND UPDATES WITH VIRTUAL CAPTURE OF AS BUILT FEATURES; the contents of each of which are relied upon and incorporated herein by reference.

FIELD OF THE INVENTION

The present invention relates to methods and apparatus for improved modeling, deployment and updating of residential structures based upon Experiential Data and one or more user Objectives. User Objectives may include allocation of resources required for a level of structure Performance during deployment. Design, repair, maintenance and upgrades to a residential structure are modeled with an automated system that incorporates "as built" data and "experiential" data into a virtual model of the structure to determine a level of achievement with the user Objective.

BACKGROUND OF THE INVENTION

Traditional methods of design of a building, and in particular a residential building, are primarily accomplished based upon an effort to be attractive to a target market. For example, a community targeting young families will be designed with a different set of Objectives than a community targeting retirement age people. Design models are not able to quantify whether an intended Objective has been met because they are not equipped with a means to capture empirical data on an ongoing basis.

In addition to a lack of empirical data tracking whether a design Objective has been met, traditional models include very little by way of tracking Performance of a residential building. Typically, a service call to make a repair to a building, or to upgrade an aspect of the building, requires an onsite visit to survey an associated structure, equipment and appliances involved.

Similarly, while traditional methods of using automated design tools, such as AutoDesk™, have greatly increased the capabilities of virtual models of structures, very little has been done to quantify Performance of Design Features, such as walls, ingress/egress, windows, ceiling designs, textures, building materials, placement of structural beams, utilities and equipment.

More sophisticated design systems include "virtual reality" models. Virtual reality models may include two dimensional and/or three dimensional views from one or more user selected Vantage Points within the model of the structure. However, in general, access to the automated modeling ends with the construction of the building that has been modeled. Hard copy prints of a residential building may be available; however there is no guarantee that a building was constructed according to design plans or which equipment and appliances will be encountered.

SUMMARY OF THE INVENTION

Accordingly, the present invention provides for automated apparatus for improved modeling of construction, deployment and updating of a residential structure. The improved modeling is based upon generation of Experiential Data captured with Sensors located in or proximate to the residential structure. The automated apparatus is also operative to model compliance with one or more user Objectives for the residential structure.

User stated Objectives may include allocation of resources required for a level of structure Performance during deployment. Design, repair, maintenance and upgrades to a residential structure are modeled with the automated apparatus by incorporating "as built" data that is descriptive of a physical structure and "experiential" data derived from experiential sensor readings that are incorporated into a virtual model of the structure and thereby determining a level of compliance with the user stated Objective.

In another aspect of the present invention, a virtual model of a residential structure extends beyond a design stage of the structure into an 'as built" stage of the structure and additionally includes generation and analysis of Experiential Data capturing conditions realized by the residential structure during a deployment stage of the structure.

In general, one or more of: solid state; electrical; and electromechanical devices (or combination thereof); generate data capturing conditions experienced by a structure. In addition, a user may enter data, such as for example, data descriptive of an action taken by a service technician into the automated system. Data may be aggregated for a single structure or multiple structures.

In one aspect, the virtual model may include one or more stated Objectives for which the residential structure was deployed to meet. As built data and Experiential Data are generated and analyzed for predicting a rate of success of achieving a stated Objective and quantifying a rate of success of the stated Objective.

As built data is collected that quantifies details of how a specific physical structure was actually constructed. According to the present invention, a residential structure is designed and modeled in a virtual setting. As built data is combined with a design model in a virtual setting. As built data may include one or more of: fabrication of the residential structure; repair; maintenance; upgrades; improvements; and work order execution associated with the residential structure.

In addition, Experiential Data is generated and entered into the virtual model of the structure. Experiential data may include data indicative of a factor that may be tracked and/or measured in relation to the residential structure. Experiential data is typically generated by Sensors in or proximate to the residential structure and may include, by way of non-limiting example, one or more of: vibration Sensors (such as accelerometers and piezo electro devices); force transducers; temperature sensing devices; amp meters, ohmmeters, switches, motion detectors; light wavelength capture (such as infrared temperature profile devices), water flow meters; air flow meters; and the like. Some examples of Experiential Data may include: details of operation of equipment or appliances in the residential structure; vibration measurements; electrical current draws; interior and/or exterior temperatures; opening and closings of doors and windows;

weight loads; preventive maintenance; cleaning cycles; air circulation; mold contents; thermal profiles and the like. Automated apparatus captures empirical data during construction of the residential structure and during deployment of the structure.

In some embodiments empirical data may be used to track achievement a defined Objective. Empirical data may also be used schedule deployment of assets for the residential building. Deployment of assets may include one or more of: human resources in the form of man hours; equipment, consumer devices, fixtures, appliances, maintenance items and the like. Deployment of assets may also include tracking of pecuniary equivalents of assets or other fungible equivalent.

In preferred embodiments, dedication of one or more assets for which a value may be subscribed, is translated into a modification of the residential structure. A return on investment for a dedicated asset may be captured via the automated apparatus as additional empirical data. Empirical data may also be used to increase the accuracy of virtual models generated by the automated apparatus that are descriptive of the residential structure. A return on investment may be measured according to variables involved, for example, increase energy efficiency resulting from preventative maintenance procedures may be measured according to an amount of power required for similar Performance pre and post the PM procedure, or fewer user complaints. In another aspect, return on investment may be translated to a fungible item, such as currency or other financial amount, in order to best track disparate variables on a comparative basis.

By way of additional example, it may be determined that water consumption in a particular residential structure, or a particular class of residential structures, will be analyzed to determine if it is prudent to make modifications to the particular residential structure or class of residential structures. The automated apparatus of the present invention will include as built data for features of the structure that is accessed in modeling proposed modifications and upgrades. Relevant As Built Features may include features for which relevancy may seem obvious, such as, for example, one or more of: number of baths; number of plumbing fixtures; type of plumbing fixtures; use bath tubs versus of showers; number of bedrooms; type of water disposal (i.e. sewer or septic); appliance models and efficiency (i.e. washer, ice maker, dishwasher). In addition, other As Built Features, for which relevancy may not seem obvious, but which unstructured queries draw a correlation may also be included, for example, it may be determined that a single story structure of a similar number of bathrooms, appliances and bedrooms utilizes less water than a multi-story structure. Location of bathrooms or water closets relative to other living areas may also be deemed relevant by unstructured query analysis. An unstructured query of captured data quantifying actual water usage may determine that the single story building uses less water. It may later be determined that the single story structure is more likely to house older people that are empty nesters and that the empty nesters shower less often, run fewer cycles of a washing machine and dishwasher; or other trends.

As discussed more fully below, captured data may include empirical quantifications of a number of times a water valve is turned on and off, vibrations within a structure, temperature within a structure, doors opening and closing, stairs ascended and descended, hours of occupancy of the structure and other variable values. Captured data may also be used to generate a determination of how a structure is being used, such as a number of occupants of a structure; approximate age of the occupants of the structure; habits of the occupants, etc. As discussed more fully below, empirical Sensor data associated with particular occupant behaves within a residential structure may also be correlated with structure Performance based upon who occupies a particular structure, when they occupy and for how long.

The automated apparatus combines a model of a structure that has been designed and provides precise additions to the model based upon data capture of features actually built into the structure. Service calls that may include one or more of: repairs, upgrades, modifications and additions (hereinafter generally referred to as "Service Call"), may access data indicating precise features included in a building, as well as technical support for the features, maintenance logs and schedules, "how to" documentation and video support, virtual connection to specialists and experts, and a time line of original as built details and subsequent modifications. Modifications may include repairs, updates and/or additions to a structure.

The improved methods taught herein provide for the Performance of repairs, maintenance and upgrades via access to a system that incorporates "as built" data into the design model. Geolocation and direction will be used to access virtual reality representations of a home including actual "as built imagery" incorporated into the design model that accurately indicates locations and types of features and also provide images or other captured data. Exemplary data may include as built locations of structural components (studs, headers, doorways, windows, rafters etc.); HVAC, electrical, plumbing, appliances, equipment, etc. Virtual repair may include "how to" instructions and video, technical publications, aggregated of similar repair orders and the like. An onsite technician may verify correct location of an equipment unit based upon GPS, triangulation, direction determinations.

A virtual reality model may additionally include virtual operation of appliances and equipment and use of modeled house based upon aggregated data from one or more as built structures. Upon conclusion of a repair, maintenance, upgrade or addition. Additional information quantifying time, place, nature of procedure, parts installed, equipment, new component location etc. may be captured and incorporated into a virtual model.

Some embodiments of the present invention include capturing data of procedures conducted during a Service Call and inclusion of relevant data into a virtual model. Precise data capture may include actual locations of building features such as, electrical wiring and components, plumbing, joists, headers, beams and other structural components. Data capture may be ongoing over time as the building is used and modified, or updated during the life of a structure (sometimes referred to herein as the "Operational" or "Deployed" stage of the structure).

An Operational Stage may include, for example: occupation and use of a Residential Property, as well as subsequent modifications, repairs and home improvements. The Residential Property may include one or more modeled structures, such as: a house, an outbuilding and facilities included in a Residential Property. Facilities may include, for example, one or more of: a swimming pool, tennis court or other manmade feature included on a property. Smart Devices with unique methods of determining a location and direction of data capture are utilized to gather data during construction of modeled buildings or other structures and during deployment of the buildings during the Operational Stage.

In general, Smart Devices provide ongoing collection of "as built" and "as used" data that is captured during construction and deployment of a residential building. The collected data is further correlated with design data and used to track Performance of features included in a design of residential structures and/or features included within the confines of a Residential Property parcel ("Residential Property").

In another aspect, collected data may be used to predict Performance of a Residential Property based upon features built into the structure and conditions experienced by the Residential Property. As built data may include modifications to a Residential Property that are made during a construction phase, and/or during a deployment phase, of a Residential Property life cycle. Similarly, as used data may include details quantifying one or more of: usage, maintenance, repairs and improvements performed on the Residential Property.

In still another aspect of the present invention, predictive analytics may be performed to predict a life of various components included in the Residential Property. Maintenance procedures and replacement of consumables or other parts may also be budgeted and scheduled based upon a correlation of a) design data; b) as built data; and c) as used data. In addition, contemplated improvements may be modeled according to an expected return on investment ("ROI"). An expected ROI may be calculated according to one or more of: an Objective level of measurements, an amount of a fungible item, such as kilowatt, gallon, currency, volume or other quantity expended during the life of deployment; and satisfaction of users and Performance.

Predictive analytics may include monitoring use of equipment and appliances. The monitoring may include data collection that is stored in a controller and analyzed, such as, via artificial intelligence routines. In some embodiments, data gathered during monitoring may be transmitted to a centralized location and aggregated with other similar type buildings, equipment and appliances. Analytic profiles may be generated. Predicted Performance and failures may be generated and used to schedule Service Calls before a physical failure occurs. Profiles may include degrees of usage, consumables, electric current draws, vibration, noise, image capture and the like.

In some embodiments, a comprehensive cost of build and deployment, including maintenance costs incurred during deployment of a Residential Property may be calculated and included into one or both of: a sale price of a Residential Property; and a lease value of a Residential Property and overall asset volume of the Residential Property. In still another aspect, a comprehensive cost of build and deployment may be amortized over a term of years. Still further, an amortized cost may be included in a scheduled payment for a term of years, such as, for example a monthly mortgage payment, wherein the monthly mortgage payment includes total cost or ownership. Total cost of ownership may include one or more of: ownership, repair and maintenance and energy usage.

Still another aspect includes generation of virtual reality user interfaces based upon a) design data; b) as built data; c) as used data; and d) improvement data. A virtual reality user interface may be accessed as part of one or more of: a maintenance routine; to support a change order for the Residential Property; and to contemplate improvements in a Residential Property. As built and as deployed data may include data quantifying repairs and updates to the Residential Property.

In some embodiments, a) design data; b) as built data; c) Experiential Data; and d) Lead Actions and Lag Benefit measurements, as they relate to multiple Residential Properties may be aggregated and accessed to support one or more Residential Properties. Access to aggregated data may include execution of artificial intelligence (AI) routines. AI routines may include, by way of non-limiting example, unstructured queries operative to predict Performance metrics and maintenance needs. Additional AI may include one or more amounts of a fungible item.

DESCRIPTION OF THE DRAWINGS

The accompanying drawings, that are incorporated in and constitute a part of this specification, illustrate several embodiments of the invention and, together with the description, serve to explain the principles of the invention:

FIGS. 3A-3F, are illustrations of exemplary aspects of collecting and displaying data by scanning a residential facility during its construction.

DETAILED DESCRIPTION

Figure 1A:
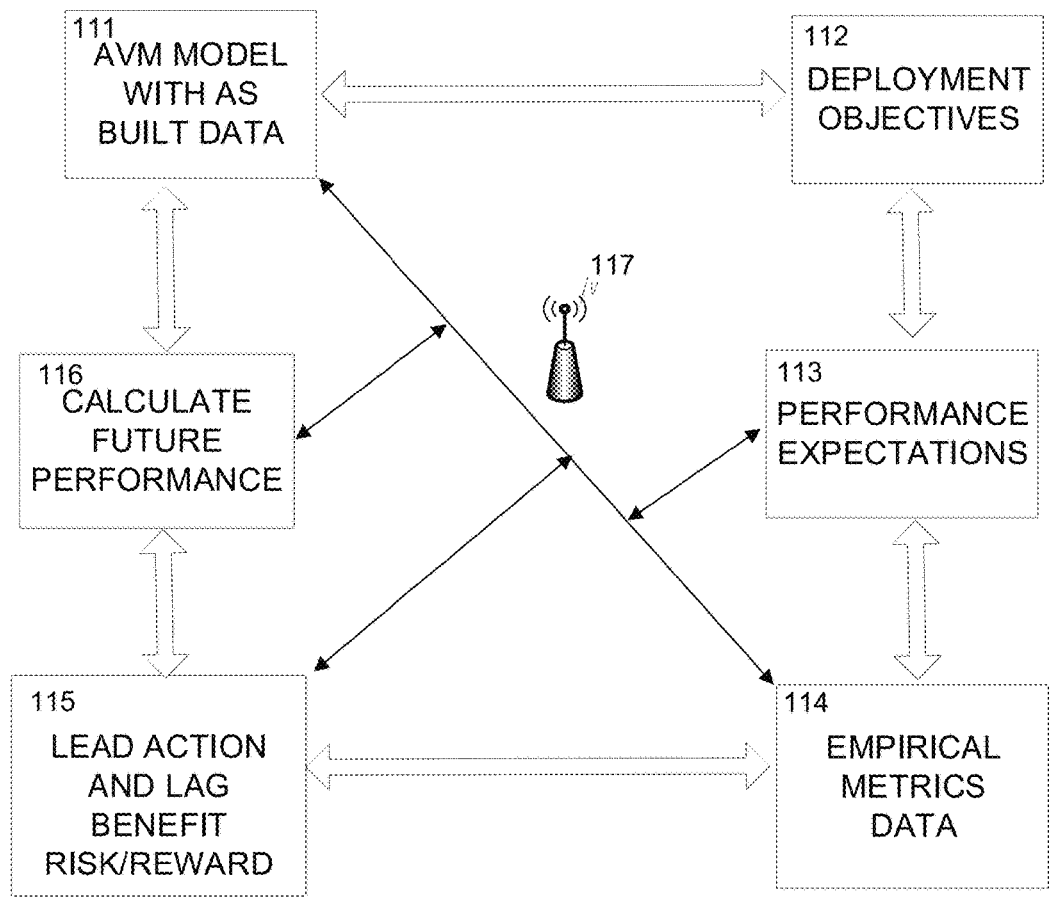
FIG. 1A illustrates a block diagram of inter-relating functions included in automated systems according to the present invention.

The present invention provides automated apparatus and methods for generating improved Augmented Virtual Models (sometimes referred to herein as an "AVM") of a residential structure; the improved AVMs are capable of calculating a likelihood of achieving stated Objective specified by a user. In addition, the improved model may be operative to generate target Objectives based upon as built and Experiential Data.

The Augmented Virtual Model of the Residential Property may include a conceptual model and progress through one or more of: a) a design stage; b) a build stage; c) a deployment stage; d) a service stage; e) an modification stage; and f) a dispensing stage. As discussed more fully herein, the AVMs according to the present invention include original design data matched to as built data captured via highly accurate geolocation, direction and elevation determination. As built data is matched with a time and date of data acquisition and presented in two dimensional (2D) and three dimensional (3D) visual representations of the Residential Property. The augmented models additionally include data relating to features specified in a Residential Property design and data collected during building, deployment, maintenance and modifications to the Residential Property. In some embodiments, a fourth dimension of time may also be included.

An Augmented Virtual Model is created in a virtual environment that exists parallel to physical embodiments of the Augmented Virtual Model in a physical environment. Details of one or more physical structures and other features within a real estate parcel are generated and quantified and represented in the Augmented Virtual Model. The Augmented Virtual Model exists in parallel to a physical structure in that the AVM includes virtual representations of physical structures and additionally receives and aggregates data relevant to the structures. The aggregation of data may be one or more of: a) according to an episode (i.e. onsite inspection, repair, improvement etc.); b) periodic; and c) in real time (without built in delay).

The experience of the physical structure is duplicated in the virtual Augmented Virtual Model. The Augmented Virtual Model may commence via an electronic model generated via traditional CAD software or other design type software. In addition, the AVM may be based upon values for variables, including one or more of: usage of a structure; usage of components within the structure; environmental factors encountered during a build stage or deployment stage; and metrics related to Performance of the structure. The metrics may be determined, for example, via measurements performed by Sensors located in and proximate to structures located on the Residential Property.

In another aspect, an Augmented Virtual Model may be accessed in relation to modelling achievement of stated Objective. Accurate capture of As Built Features and aggregated data of similar buildings, equipment types, appliances and usage profiles assist in one or more of: selecting appropriate technicians to deploy to a service call; providing correct consumables and replacement parts, scheduling a Service Call; scheduling building, equipment and/or appliance upgrades; matching a building, equipment and appliance set to a particular type of deployment; providing on site guidance during the Service Call; providing documentation relevant to the building, equipment and appliances; providing access to remote experts that guide onsite technicians.

In some embodiments, a technical library specific to a particular property and location within the property may be maintained for each Residential Property and made accessible to an onsite technician and/or remote expert. The library may include, but is not limited to: structure, equipment/appliance manuals; repair bulletins, and repair/maintenance. Appropriate how to videos may also be made available based upon an AVM with as built and Experiential Data.

In another aspect, a parts ordering function may be included in the Augmented Virtual Model. Augmented parts ordering may allow a technician to view an ordered part and view a virtual demonstration of the part in use.

Aspects of the Augmented Virtual Model may be presented via a user interface that may display on a tablet or other flat screen, or preferably be presented in a virtual reality environment, such as via a virtual reality headset.

The present invention additionally provides for the Augmented Virtual Model to forecast future Performance of a Residential Property based upon the values of variables included in data aggregated during the design, build and deployment of the Residential Property sometimes referred to herein as: a) design data; b) as built data; and c) as deployed data.

The improved modelling system incorporates "as built" data into the improved design model. An onsite or remote technician may access the as built data to facilitate. The as built data is generated and/or captured via highly accurate geolocation, direction and elevation determination. Based upon the geolocation, direction and elevation determination, as built data is incorporated into a design model at a precise location within the model. In some embodiments, a time and date of data acquisition may be associated with updates to aspects of the improved design model such that a chronology of changes within the model. Original design aspects and updated design aspects may be presented in two dimensional (2D) and three dimensional (3D) visual representations of the Residential Property. The present invention provides for systematic updates to as built data during a service call. The updated data may verify and/or correct previously included data and also be used to memorialize modifications made during a Service Call.

Some exemplary embodiments may include updates to an AVM that include, one or more of: quantifying a make and model of equipment and appliances on site; time and date notation of change in location specific data; Model accessed and/or updated according to XYZ and direction data; XY data may include high lever level location designation (i.e. such as a street address) and highly specific position designation (i.e. particular room and wall); combination of two types of position data; GPS, Differential GPS; references used during triangulation; aggregate data across multiple homes for reference; suggestions on how to remodel; designs that perform well; designs that fail; popularity of various aspects; access to and/or generation of multiple Augmented Virtual Models; original and modified model versions; index according to date/time stamp; index according to feature; index according to popularity; index according to cost; index according to User specific query; plumbing; electrical; HVAC; structural; access areas (i.e. crawl spaces, attics); periodic data and position capture with camera/Sensor attached to a fixed position; and during one or more of: repair/maintenance/updates.

Accordingly, actual "as built' imagery and location data is incorporated into the design model to accurately indicate a location and type of feature included in a structure, and provide "pictures" or other captured data. Exemplary data may include as built locations of structural components (studs, headers, doorways, windows, rafters etc.); HVAC, electrical, plumbing, appliances, equipment, etc. A virtual reality model may additionally include virtual operation of appliances and equipment and use of a residential structure based upon aggregated data from the structure, as well as annotations and technical specifications relating to features included in the as built model of a residential structure identified by time, date, geolocation and direction.

In some embodiments, an initial digital model may be generated according to known practices in the industry. However, unlike previously known practices, the present invention associates an initial digital model with a unique identifier that is logically linked to a geolocation and one or both of date and time designation, and provides updates to the original model based upon data captured at the geolocation during a recorded timeframe. In this manner, a Virtual Reality Simulation is generated that logically links a digital model to a specific geographic location and actual As Built data at the specific geographic location. The updated model may be virtually accessed from multiple locations such as a field office, onsite, a technical expert, a financial institution, or other interested party.

In some preferred embodiments, the geographic location will be provided with accurately placed location reference points. The location reference points may be accessed during activities involved in a Service Call on the Residential Property, such as a repair or upgrade to a house or other structures included within the curtilage surrounding the house (i.e. pool, tennis court, shed, garage, etc.). Accuracy of the reference points may or may not be associated with location relevance beyond the Residential Property, however they do maintain accuracy within the Residential Property.

Preferred embodiments may also include reference points accurately placed within a house or other structure located on the Residential Property. As further discussed below, the reference points may include, by way of non-limiting example, a wireless transmission data transmitter operative to transmit an identifier and location data; a visual identifier, such as a hash code, bar code, color code or the like; an infrared transmitter; a reflective surface, such as a mirror; or other means capable of providing a reference point to be utilized in a triangulation process that calculates a precise location within the house or other structure.

Highly accurate location position may be determined via automated apparatus that multiple levels of increasingly accurate location determination. A first level may include use of a GPS device providing a reading to first identify a Residential Property. A second level may use position transmitters located within or proximate to, the Residential Property to execute triangulation processes in view of on-site location references. A GPS location may additionally be associated with a high level general description of a property, such as, one or more of: an address, a unit number, a lot number, a taxmap number, a county designation, Platte number or other designator. The on-site location references may include one or more of: near field radio communication beacons at known X-Y position reference points; line of sight with physical reference markers; coded via ID such as Bar Code, Hash tag, alphanumeric or other identifier. In some embodiments, triangulation may calculate a position within a boundary created by the reference points to within millimeter range. In some embodiments, Differential GPS may be used to accurately determine a location of a Smart Device with a sub centimeter accuracy.

In addition to a position determination, such as latitude and longitude or other Cartesian Coordinate (which may sometimes be indicated as an "X and Y" coordinate), the present invention provides for a direction and elevation (sometimes referred to herein as a "Z" direction) of a feature for which as built data is captured and imported into the improved virtual model.

According to the present invention, a direction dimension may be based upon a movement of a device. For example, a device with a controller and an accelerometer, such as mobile Smart Device, may include a user display that allows a direction to be indicated by movement of the device from a determined location acting as a base position towards an as built feature in an extended position. In some implementations, the Smart Device may first determine its position based upon triangulation with the reference points. The process of determination of a position based upon triangulation with the reference points may be accomplished, for example via executable software interacting with the controller in the Smart Device, such as, for example via running an app on the Smart Devices.

In combination with, or in place directional movement of a device in order to quantify a direction of interest to a user, some embodiments may include an electronic and/or magnetic directional indicator that may be aligned by a user in a direction of interest. Alignment may include, for example, pointing a specified side of a device, or pointing an arrow or other symbol displayed upon a user interface on the device towards a direction of interest.

In a similar fashion, triangulation may be utilized to determine a relative elevation of the Smart Device as compared to a reference elevation of the reference points.

It should be noted that although a Smart Device is generally operated by a human user, some embodiments of the present invention include a controller, accelerometer, data storage medium, Image Capture Device, such as a Charge Coupled Device ("CCD") capture device and/or an infrared capture device being available in a handheld or unmanned vehicle.

An unmanned vehicle may include for example, an unmanned aerial vehicle ("UAV") or ground level unit, such as a unit with wheels or tracks for mobility and a radio control unit for communication.

In some embodiments, multiple unmanned vehicles may capture data in a synchronized fashion to add depth to the image capture and/or a three dimensional and 4 dimensional (over time) aspect to the captured data. In some implementations, UAV position will be contained within a perimeter and the perimeter will have multiple reference points to help each UAV (or other unmanned vehicle) determine a position in relation to static features of a building within which it is operating and also in relation to other unmanned vehicles. Still other aspects include unmanned vehicles that may not only capture data but also function to perform a task, such as paint a wall, drill a hole, cut along a defined path, or other function. As stated throughout this disclosure, the captured data may be incorporated into the virtual model of a residential structure.

In another aspect, captured data may be compared to a library of stored data using recognition software to ascertain and/or affirm a specific location, elevation and direction of an image capture location and proper alignment with the virtual model. Still other aspects may include the use of a compass incorporated into a Smart Device.

In still other implementations, a line of sight from a Smart Device, whether user operated or deployed in an unmanned vehicle, may be used to align the Smart Device with physical reference markers and thereby determine an XY position as well as a Z position. Electronic altitude measurement may also be used in place of, or to supplement, a known altitude of nearby reference point. This may be particularly useful in the case of availability of only a single reference point.

Reference points may be coded via identifiers, such as a UUID (Universally Unique Identifier), or other identification vehicle. Visual identifiers may include a bar code, hash tag, Alphanumeric or other symbol. Three dimensional markers may also be utilized.

By way of non-limiting example, on site data capture may include designation of an XYZ reference position and one or more of: image capture; infra-red capture; Temperature; Humidity; Airflow; Pressure/tension; Electromagnetic reading; Radiation reading; Sound readings (i.e. level of noise, sound pattern to ascertain equipment running and/or state of disrepair), and other vibration or Sensor readings (such as an accelerometer or transducer).

In some embodiments, vibration data may be used to profile use of the building and/or equipment and appliances associated with the building. For example, vibration detection may be used to determine human related activity, such as, by way of non-limiting example: foot traffic, physical activities, loud music, running, dancing and the like, as well as a number of people in the building and a calculated weight and mobility of the people. Vibration readings may also be used to quantify operation of appliances and equipment associated with the building, such as HVAC, circulators and water pumps. Vibration data may be analyzed to generate profiles for properly running equipment and equipment that may be faulty and/or failing. The improved virtual model of the present invention may be updated, either periodically or on one off occasions, such as during a service call or update call.

In some embodiments, a fourth dimension in addition to an XYZ dimension will include date and time and allow for an historical view of a life of a structure to be presented in the virtual model. Accordingly, in some embodiments, onsite cameras and/or Sensors may be deployed and data may be gathered from the on-site cameras and Sensors either periodically or upon command. Data gathered may be incorporated into the improved virtual model.

In still another aspect, the improved virtual model may aggregate data across multiple Residential Properties and buildings. The aggregated data may include conditions experienced by various buildings and mined or otherwise analyzed, such as via artificial intelligence and unstructured queries. Accordingly, the improved virtual model may quantify reasons relating to one or more of: how to remodel or otherwise improve, designs that work well; designs that fail; popular aspects; generate multiple Virtual Models with various quantified features; original and modified model versions and almost any combination thereof.

Although data may be gathered in various disparate and/or related ways, an aggregate of data may be quickly and readily accessed via the creation of indexes. Accordingly, indexes may be according to one or more of: date/time stamp; feature; popularity; cost; User specific query; Plumbing; Electrical; HVAC; Structural aspects; Access areas (i.e. crawl spaces, attics); Periodic data and position capture with camera/Sensor attached to a fixed position; during construction; during modification; during deployment; airflow; HVAC; appliances (refrigerator door open close, dishwasher, washer); traffic flows during use of structure; audible measurements for noise levels; and almost any other aspect of captured data.

In another aspect, an Augmented Virtual Model may receive data descriptive of generally static information, such as, one or more of: product specifications, building material specifications, product manuals, and maintenance documentation. The generally static information may be utilized within the Augmented Virtual Model to calculate Performance of various aspects of a Residential Property. Dynamic data that is captured during one of: a) design data; b) build data; and c) deployed data, may be used to analyze actual Performance of a Residential Property and also used to update an Augmented Virtual Model and increase the accuracy of additional predictions generated by the Augmented Virtual Model. Maintenance records and supporting documentation may also be archived and accessed via the AVM. A variety of Sensors may monitor conditions associated with one or both of the structure and the parcel. The Sensors and generated data may be used to extrapolate Performance expectations of various components included in the Augmented Virtual Model. Sensor data may also be aggregated with Sensor data from multiple Augmented Virtual Model models from multiple structures and/or Residential Properties and analyzed in order to track and/or predict Performance of a structure or model going forward.

Glossary

"Ambient Data" as used herein refers to data and data streams captured in an environment proximate to a Vantage Point and/or an equipment item that are not audio data or video data. Examples of Ambient Data include, but are not limited to Sensor perception of: temperature, humidity, particulate, chemical presence, gas presence, light, electromagnetic radiation, moisture and mineral presence.

"Analog Sensor" as used herein includes a Sensor operative to quantify a state in the physical world in an analog representation.

"As Built" and "as built" as used herein refers to details of a structure associated with a specific location within a structure or parcel and empirical data captured in relation to the specific location.

"As Built Features" as used herein refers to a feature in a virtual model or AVM that is based at least in part upon empirical data captured at or proximate to the location of the feature. Examples of As Built Features include placement of structural components such as a wall, doorway, window, plumbing, electrical utility, appliance and/or improvements to a parcel, such as a well, septic, electric or water utility line, easement, berm, pond, wet land, retaining wall, driveway, right of way and the like.

"Augmented Virtual Model" (sometimes referred to herein as "AVM"): as used herein is a digital representation of a real property parcel including one or more physical structures suitable for residential use and as built data captured descriptive of the real property parcel. The Augmented Virtual Model includes As Built Features of the structure and may include improvements and features contained within the real property parcel.

"Directional Indicator" as used herein shall mean a quantification of a direction generated via one or both of: analogue and digital indications.

"Directional Image Data" as used herein refers to image data captured from a Vantage Point with reference to a direction. Image data may include video data.

"Directional Audio" as used herein refers to audio data captured from a Vantage Point within or proximate to a Residential Property and from a direction "Deployment Objective" as used herein shall mean one or more subject of concern related to a use of a residential structure included in an AVM.

"Design Feature" as used herein, shall mean a value for a variable descriptive of a specific portion of a Residential Property. A Design Feature may include, for example, a size and shape of a structural element or other aspect, such as a doorway, window or beam; a material to be used, an electrical service, a plumbing aspect, a data service, placement of electrical and data outlets; a number of steps; an incline; or other discernable value for a variable associated with a structure or Residential Property feature.

"Digital Sensor" as used herein includes a Sensor operative to quantify a state in the physical world in a digital representation.

"Experiential Data" as used herein shall mean data captured on or proximate to a subject residential structure descriptive of a condition realized by the residential structure. Experiential data is generated by one or more of: digital and/or analog sensors, transducers, image capture devices, microphones, accelerometers, compasses and the like.

"Experiential Sensor Reading" as used herein shall mean a value of a sensor output generated within or proximate to a subject residential structure descriptive of a condition realized by the residential structure. An Experiential Sensor Reading may be generated by one or more of: digital and/or analog sensors, transducers, image capture devices, microphones, accelerometers, compasses and the like.

"Image Capture Device" or "Scanner" as used herein refers to apparatus for capturing digital or analog image data, an Image capture device may be one or both of: a two dimensional camera (sometimes referred to as "2D") or a three dimensional camera (sometimes referred to as "3D"). In some examples an Image Capture Device includes a charged coupled device ("CCD") camera.

"Lag Benefit" as used herein shall mean a benefit derived from, or in relation to a Lead Action.

"Lead Actions" as used herein shall mean an action performed on, in, or in relation to a Residential Property to facilitate attachment of an Objective.

"Objective" as used herein shall mean a subject area of concern specified in an AVM.

"Performance" as used herein may include one or more of metric of an Objective. Examples of Performance may include metrics of: energy efficiency; length of service; total cost of operation; total quality of goods processed or manufacture; total yield; and total human resources required.

"Residential Property" as used herein shall mean one or more real estate parcels suitable for human habitation.

"Sensor" as used herein refers to one or more of a solid state, electro-mechanical, and mechanical device capable of transducing a physical condition or property into an analogue or digital representation and/or metric.

"Smart Device" as used herein includes an electronic device including, or in logical communication with, a processor and digital storage and capable of executing logical commands.

"Total Resources" as used herein shall mean an aggregate of one or more types of resources expended over a time period.

"Vantage Point" as used herein refers to a specified location which may be an actual location within a physical facility or a virtual representation of the actual location within a physical facility.

"Virtual Residential Structure" ("VRS"): as used herein shall mean a digital representation of a physical structure suitable for residential use. The Virtual Residential Structure may include Design Features and As Built features. The Virtual Residential Structure may be included as part of a Virtual Residential Model.

Referring now to FIG. 1A a block diagram illustrates various aspects of the present invention and interactions between the respective aspects. The present invention includes an Augmented Virtual Model 111 of a residential structure that includes As Built Features. The generation and inclusion of As Built Features, based upon location and direction specific data capture, is discussed more fully below. Data may be transmitted and received via one or both of digital and analog communications, such as via a wireless communication medium 117.

According to the present invention, one or more Deployment Objectives 112 are entered into automated apparatus in logical communication with the AVM. The Deployment Objective may essentially include a purpose to be achieved during deployment of a modeled residential structure. By way of non-limiting example, a Deployment Objective may include one or more of: a level of energy efficiency; a level of water consumption; mean time between failure for equipment included in the residential structure; mean time between failure for appliances installed in the structure; a threshold period of time between repairs on the residential structure; a threshold period of time between upgrades of the residential structure; a target market value for a Residential Property; a target lease or rental value for a Residential Property; a cost of financing for a Residential Property; Total Cost of ownership of a Residential Property; Total Cost of Deployment of a Residential Property or other quantifiable aspect.

In some embodiments, Deployment Objectives may be related to a fungible item, such as a measurement of energy (KWH of electricity, gallon of fuel oil, cubic foot of gas, etc.); man hours of work; trade medium (i.e. currency, bitcoin, stock, security, option etc.); or other quantity. Relating multiple disparate Deployment Objectives to a fungible item allows disparate Objectives to be compared for relative value.

Performance Expectations 113 may also be entered into the automated apparatus in logical communication with the AVM 111. The Performance Expectations 113 may include an appropriate level of Performance of an aspect of the structure in the AVM affected by the Deployment Objective 112. For example, a Performance Expectation 113 for energy efficiency for a structure modeled may include a threshold of KW hours of electricity consumed by the structure on a monthly basis. Similarly, a target market value or lease value may be a threshold pecuniary amount. In some embodiments, a pecuniary amount may be according to a period of time, such as monthly, or a term of years.

Empirical Metrics Data 114 may be generated and entered into the automated apparatus on an ongoing basis. The Empirical Metrics Data 114 will relate to one or more of the Deployment Objectives and may be used to determine compliance with a Deployment Objective and/or a Performance Expectations. Empirical Metrics Data 114 may include, by way of non-limiting example, one or more of: a unit of energy; an unit of water; a number of service calls; a cost of maintenance; a cost of upgrades; equipment details, design details, appliance details, identification of human resources deployed; identification of organizations deployed; number of residents; demographics of residents (i.e. age, gender, occupations, employment status, economic status, requiring assistance with basic living necessities; and the like); percentage of time structure is occupied; purpose of occupancy (i.e. primary residence, secondary residence, short term rental, long term lease, etc.); Sensor readings (as discussed more fully below); man hours required for structure repair/maintenance/upgrades; total currency (or other fungible pecuniary amount) expended on behalf of a structure or property.

In addition to Empirical Metrics Data 114, Lead Actions and expected Lag Benefits 115 that may cause an effect on one or both of a Deployment Objective 112 and a Performance Expectation 113, may be entered into the automated apparatus. A Lead Action may include an action expected to raise, maintain or lower an Empirical Metrics Data 114. For example, an action to install water efficient plumbing fixtures may be scheduled in order to improve water consumption metrics. Similar actions may relate to electrically efficient devices, or automatic electric switches being installed; preventive maintenance being performed; home automation devices being installed and the like. Other Lead Actions may include limiting a demographic of occupants of a structure to a certain demographic, such as senior citizens. An expected benefit may be measured in Lag Benefit measurements, such as those described as Empirical Metrics Data 114, or less tangible benefits, such as occupant satisfaction.

The automated apparatus may also be operative to calculate future Performance 116 based upon one or more of: AVM Model with As Built Data 111; Deployment Objectives 112; Performance Expectations 113 and Empirical Metrics Data 114. Future Performance may be calculated in terms of an appropriate unit of measure for the aspect for which Performance is calculated, such as, for example: an energy unit; man hours; mean time between failures and dollar or other currency amount.

Calculation of Future Performance 116 may be particularly useful to calculate Total Resources calculated to be required to support a particular structure, group of structures, properties and/or group of properties over a term of years ("Total Resources Calculated"). Total Resources Calculated may therefore be related to calculations of future Performance 116 and include, for example, one or more of: energy units; water units; man hours; equipment; appliances and dollars (or other currency or fungible item). In some embodiments, calculations of future Performance may include a Total Cost of Ownership for a term of years. For example, a Total Cost of Ownership for a Residential Property may include a purchase amount and amounts required for maintenance, repair and upgrades from day one of deployment through twenty years of deployment (a shorter or longer term of years may also be calculated).

Accordingly, some embodiments may include a calculation of Total Resources required that includes a purchase price of a property with a residential structure, that incorporates a total cost associated with the property over a specified term of years. The total cost will be based upon the AVM with As Built Data 111; Deployment Objectives 112; Performance Expectations 113 and Empirical Metrics Data 114.

Moreover, Total Resources required may be aggregated across multiple properties and Structures. Aggregation of properties may be organized into property pools to mitigate risk of anomalies in the Calculation of Future Performance. Of course the benefits of property ownership and/or management may also be pooled and compared to the Total Resources required. In various embodiments, different aspects of calculated future Performance 116 may be aggregated and allocated to disparate parties. For example, first aggregation may relate to man hours of technician time for structure repair and maintenance and the fulfillment of obligations related to the aggregation may be allocated to a first party. A second aggregation may relate to appliance Performance and obligations allocated to a second party. A third aggregation may relate to equipment Performance and obligations allocated to a third party. Other aggregations may similarly be allocated to various parties. In some embodiments, financial obligations incorporating one or both of acquisition cost and ongoing deployment costs may be allocated and financed as a single loan. Other embodiments include a calculated future Performance cost being incorporated into a purchase price.

An important aspect of the present invention includes definition and execution of Lead Actions based upon one or more of: the AVM Model with As Built Data 111; Deployment Objectives 112; Performance Expectations 113; Empirical Metrics Data 114 and Calculations of Future Performance 116.

Figure 1B:
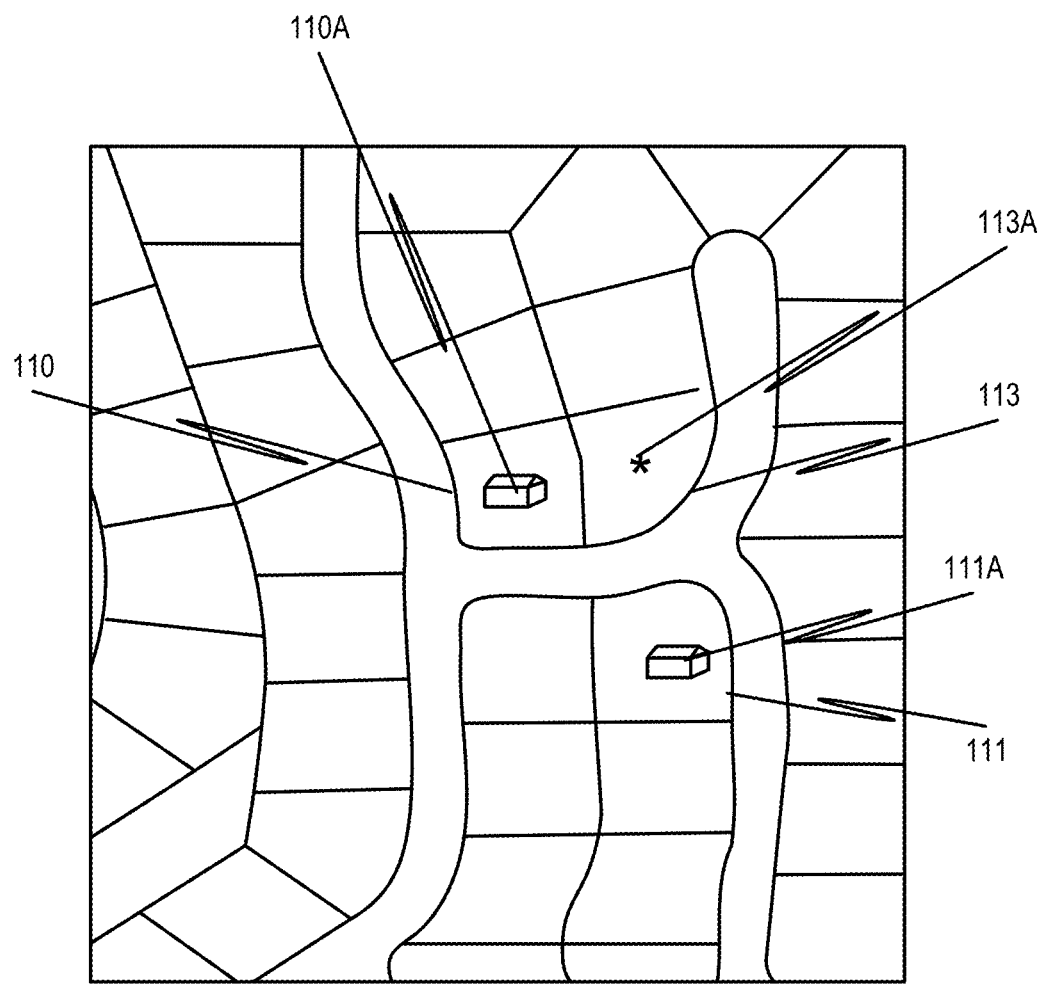
FIG. 1B illustrates geolocation aspects that may be used to identify a Residential Property and corresponding data and predictions.

Referring now to FIG. 1B, an AVM is generally associated with a Residential Property that includes a real estate parcel 110-113. According to some embodiments, one or more of an improvement, a repair, maintenance and an upgrade are performed on the Residential Property. The Residential Property is identified according to an automated determination of a location and a particular position, elevation and direction are further determined automatically within the Residential Property. Smart Devices may be used to access data records stored in an AVM according to a unique identifier of a physical location of the real estate parcel 110-113.

As illustrated, a map of real estate parcels 110-113 is shown with icons 110A-111A indicating parcels 110-111 that have virtual structures included in a virtual model associated with the parcels. Other parcels 113 have an indicator 113A indicating that a virtual model is in process of completion.

In some methods utilized by the present invention, data in an AVM may be accessed via increasingly more accurate determinations. A first level of geospatial location determinations may be based upon a real estate parcel 110-113 and a second geospatial determination may be made according to position locators (discussed more fully below) included within the boundaries of the real estate parcel 110-113. Still more accurate location position may be calculated according to one or both of a direction determination and an accelerometer. Accordingly, it is within the scope of the present invention to access a record of a design model for a specific wall portion within a structure based upon identification of a real estate parcel 110-113 and a location within a structure situated within the real estate parcel 110-113 and height and direction. Likewise the present invention provides for accessing as built data and the ability to submit as built data for a specific portion of a structure based upon an accurate position and direction determination.

In some implementations of the present invention, a Residential Property unique identifier may be assigned by the AVM and adhere to a standard for universally unique identifiers (UUID), other unique identifiers may be adopted from, or be based upon, an acknowledged standard or value. For example, in some embodiments, a unique identifier may be based upon Cartesian Coordinates, such as global positioning system (GPS) coordinates. Other embodiments may identify a Residential Property according to one or both of: a street address and a tax map number assigned by a county government of other authority.

In some embodiments, an AVM may also be associated with a larger group of properties, such as a subdivision, homeowners association, a complex, condominium, or other defined arrangement.

As illustrated, in some preferred embodiments, an electronic record correlating with a specific Residential Property may be identified and then accessed based upon coordinates generated by a GPS device, or other electronic location device. The GPS device may determine a location and correlate the determined location with an AVM record listing model data, as built data, improvement data, Performance data, maintenance data, cost of operation data, return on investment data and the like.

Figure 1C:
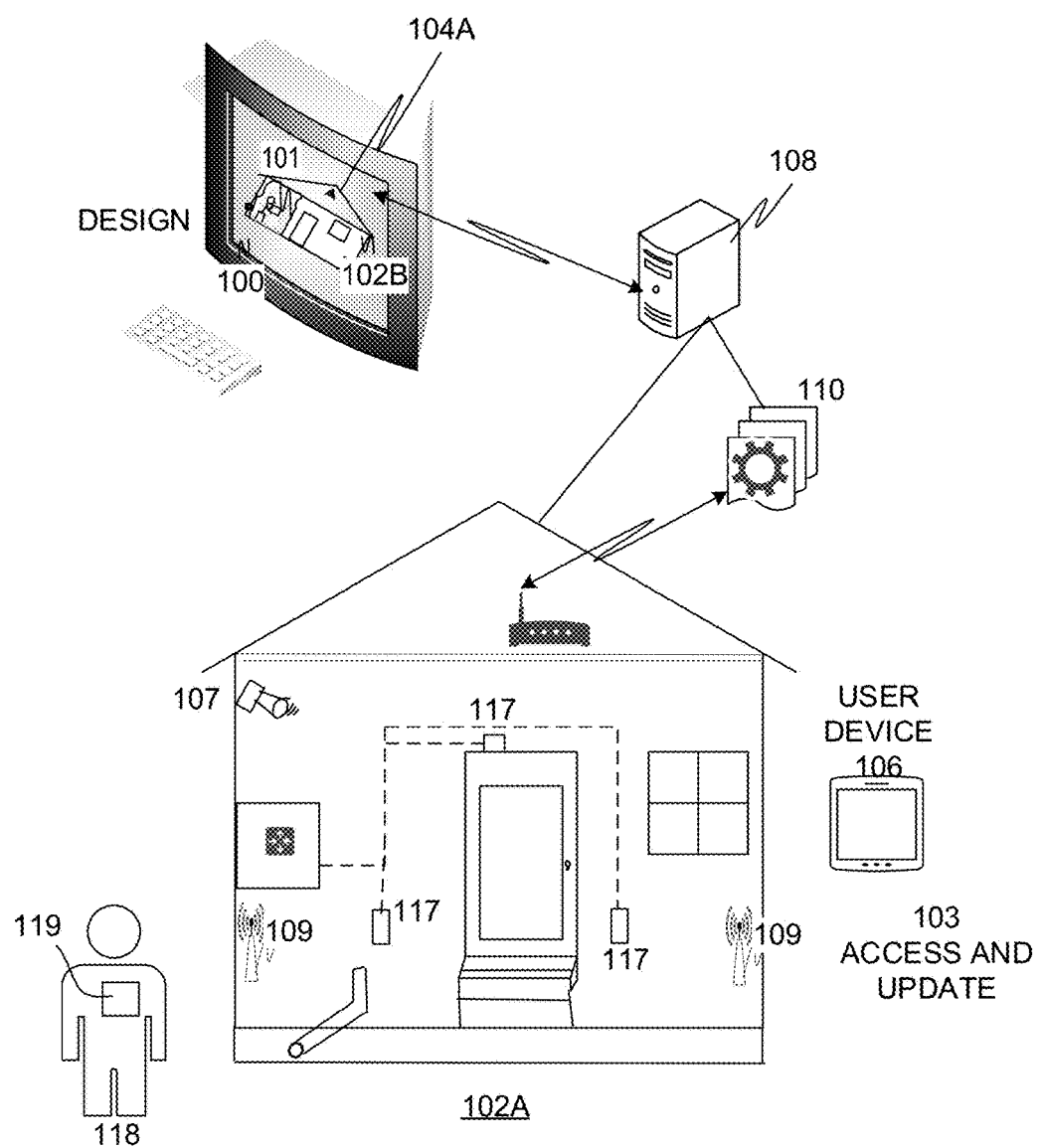
FIG. 1C illustrates a block diagram of ongoing data capture via Smart Devices and support for predictive modeling based upon the smart data capture.

Referring now to FIG. 1C, a relational view of an Augmented Virtual Model 100 with a Virtual Residential Structure 102 is illustrated. The Augmented Virtual Model 100 includes a virtual model stored in digital form with a design aspect that allows for a physical structure 102A suitable for residential use to be designed and modelled in a virtual environment. The design aspect may reference Performance data of features to be included in a Virtual Residential Structure 102B and also reference variables quantifying an intended use of the Virtual Residential Structure 102B. The Virtual Residential Structure 102B and the Augmented Virtual Model 100 may reside in a virtual setting via appropriate automated apparatus 108. The automated apparatus 108 will typically include one or more computer servers and automated processors as described more fully below and may be accessible via known networking protocols.

In correlation with the design aspect, the present invention includes an As Built Model 101 that generates a Virtual Residential Structure 102A in the context of the Augmented Virtual Model 100. The As Built Model 101 includes virtual details based upon As Built data captured on or proximate to a physical situs of a related residential physical structure 102A. The As Built data may be captured, for example, during construction or modification of a physical structure 102A.

The As Built Model 101 may include detailed data including image captures and physical measurements of features included in the physical structure 102A. The physical measurements may be during a build phase of the physical structure; or subsequent to the build phase of the physical structure. In some embodiments, original as built measurements may be supplemented with additional data structure data associated with repairs or improvements are made to the physical structure. Details of recordable build aspects are placed as digital data on a recordable medium 104 included in the automated apparatus 108.

The digital data included on a recordable medium 104 may therefore include, for example, one or more of: physical measurements capturing Experiential Data; image data (i.e. digital photos captured with a CCD device); laser scans; infra-red scans and other measurement mediums. One or more records on the recordable medium 104 of an as built structure may be incorporated into the Augmented Virtual Model 100 thereby maintaining the parallel nature of the Augmented Virtual Model 100 with the physical structure 102A.

In some embodiments, as built data on a recordable medium 104 may be generated and/or captured via an image capture device 106

As the physical structure is deployed for use, subsequent measurements that generate and/or capture Experiential Data may be made and incorporated into the Augmented Virtual Model 100. In addition, a user may access and update 103 the Augmented Virtual Model 100 to ascertain features of the physical structure 102A that have been virtually incorporated into the Augmented Virtual Model 100. In some examples, a tablet, handheld network access device (such as, for example a mobile phone) or other device with automated location service may be used to determine a general location of a physical structure 102A. For example, a smart phone with global positioning system (GPS) capabilities may be used to determine a physical address of a physical structure, such as 123 Main Street. Stored records containing data relating to 123 Main Street may be accessed via the Internet or other distributed network.

In addition to the use of GPS to determine a location of a User Device, the present invention provides for a real estate parcel with a physical structure 102A that includes more radio frequency (or other mechanism) location identifiers 109. Location identifiers 109 may include, for example, radio transmitters at a defined location that may be used to accurately identify via triangulation, a position of a user device 106, such as a: tablet, smart phone or virtual reality device. The position may be determined via triangulation, single strength, time delay determination or other process. In some embodiments, triangulation may determine a location of a user device within millimeters of accuracy.

Other location identifiers may include, by way of non-limiting example, RFID chips, a visual markings (i.e. a hash tags or barcode), pins or other accurately placed indicators. Placement of the location identifiers may be included in the Virtual Residential Model and referenced as the location of the physical user device is determined. As described above, specific location identifiers may be referenced in the context of GPS coordinates or other more general location identifiers.

Based upon the calculated location of the user device 106, details of the physical structure 102A may be incorporated into the Virtual Residential Structure 102B and presented to a user via a graphical user interface (GUI) on the user device 106.

For example, a user may approach a physical structure and activate an app on a mobile user device 106. The app may cause the user device 106 to activate a GPS circuit included in the user device and determine a general location of the user device 106, such as a street address designation. The general location will allow a correct Virtual Residential Model 104B to be accessed via a distributed network, such as the Internet. Once accessed, the app may additionally search for one or more location identifiers 109 of a type and in a location recorded in the Virtual Residential Model. A Virtual Residential Model may indicate that one or more RFID chips are accessible in a kitchen, a living room and each bedroom of a structure. The user may activate appropriate Sensors to read the RFID chips and determine their location. In another aspect, an Augmented Virtual Model 100 may indicate that location identifiers 109 are placed at two or more corners (or other placement) of a physical structure 102A and each of the location identifiers 109 may include a transmitter with a defined location and at a defined height. The user device 106, or other type of controller, may then triangulate with the location identifiers 109 to calculate a precise location and height within the physical structure.

Similarly, a direction may be calculated via a prescribed movement of the user device 106 during execution of code that will record a change in position relative to the location identifiers 109. For example, a user smart device, such as a smart phone or user device 106 may be directed towards a wall or other structure portion and upon execution of executable code, the smart device may be moved in a generally tangential direction towards the wall. The change in direction of the user device 106 relative to the location identifiers 109 may be used to calculate a direction. Based upon a recorded position within the structure 105 and the calculated direction, a data record may be accessed in the Augmented Virtual Model 100 and a specific portion of the Augmented Virtual Model 100 and/or the Virtual Residential Structure 102B may be presented on the user device 106. In other embodiments, a direction may be made, or verified via a mechanism internal to the smart device, such as a compass or accelerometer.

In still another aspect of the present invention, in some embodiments, transmissions from one or more location identifiers 109 may be controlled via one or more of: encryption; encoding; password protection; private/public key synchronization or other signal access restriction. Control of access to location identifiers 109 may be useful in multiple respects, for example, a location identifier may additionally function to provide access to data, a distributed network and/or the Internet.

The Virtual Residential Structure 102B may include one or both of: historical data and most current data relating to aspects viewable or proximate to the user device 106 while the user device is at the calculated location in the physical structure 102. In this way, the parallel virtual world of the Augmented Virtual Model 100 and the Virtual Residential Structure may present data from the virtual world that emulates aspects in the physical world, and may be useful to the user accessing the user device 106, while the user device is at a particular physical location. As discussed within this document, data presented via the Augmented Virtual Model 100 may include one or more of: design data, as built data, Experiential Data, Performance data relating to appliances and/or features of the Augmented Virtual Model 100 or physical structure; maintenance data, and annotations.

Annotations may include, for example, a user's or designer's note recorded at a previous time, a service bulletin, maintenance log, operation instructions or a personal note to a subsequent user, such as a virtual "John Smith was here" such guest log indicating who had frequented the location. Annotations may include one or both of text and image data. For example, an annotation may include an image of the location captured at a given time and date. The image may be of a personal nature, i.e. the living room while the Smith's owned the home, or a professional nature, i.e. the living room after being painted by XYZ Contractor on a recorded date. In some embodiments, annotations may be used to indicate completion of a work order. Recordation of completion of a work order may in turn trigger a payment mechanism for paying an entity contracted to complete the work order. In another aspect, annotations may relate to a Virtual Residential Model or a Virtual Residential Structure as a whole, or to a particular aspect that is proximate to a location of the user device within the Virtual Residential Structure.

In some embodiments, details of a proposed use of a structure and parcel may be input into a design module and used to specify or recommend features to be included in an Augmented Virtual Model 100. For example, a home with an intended use of housing an elderly person or couple may include minimal steps, walk in shower facility, grab bars, remote lighting and appliance control and other features conducive to someone with less than optimal mobility. In addition, appliances included in the Virtual Residential Structure, such as a dishwasher, oven, range, hot water heater washer and dryer, etc. may be rated at medium to light duty and capacity. Other features, such as closet hardware and doors may also be tailored to the needs of older person; electrical and wireless infrastructure for remote monitoring and alert systems; floor coverings that are soft and snag free, such as low carpet or cork may be designed into a Virtual Residential Structure and included in an as built model.

Conversely a structure to contain multiple children and parents may be designed to include, one or more of: different floor levels, more bathrooms, heavy duty appliances of higher capacity, heavy duty features such as door hardware, wear resilient flooring, significant sound proofing within walls and doors, baby monitors, ubiquitous Wi-Fi and Internet access, mobile device charging stations and the like.

According to the present invention, features of a residential structure and parcel are generated within a digital design model and then tracked as the features are implemented in a build process and further tracked in Performance of the structure as it is placed into use. To the extent available, Performance is tracked in the context of variables relating to use. Variables may include, for example: a use of the structure, such as primary residence; a number of residents residing in a structure; demographics of the residents; number of months per year the structure is deployed for use; which months of the year a structure is deployed for use; a number and nature of pets kept in the structure; which hours of the day the structure is occupied and other relevant information.

As Experiential Sensor Readings are generated they may be memorialized to generate Experiential Data associated with a physical structure 102A. The Experiential Data is collected and analyzed via structured queries and may also be analyzed with Artificial Intelligence processes such as unstructured queries to derive value. In some embodiments, Experiential Data may also be associated with a human and/or an animal interacting with the structure 102A. Whereas former residential structures were generally designed and built to mitigate against variability in a human 118 and between disparate humans 118. The present invention allows for human variability to be monitored via sensors 119 and the structure to be modified to optimally inter-relate with the values for variables attributable to a human 118 that will inhabit or otherwise interact with the structure 102A. Human (and/or animal) maybe quantified with sensors 119 installed on or proximate to the Human 118. Alternatively, sensors 117 located in, or proximate to, a structure 102A may be used to monitor human variability. Biosensors may be used to provide empirical data of humans 118 interacting with a structure may be analyzed using structured or unstructured queries to device relationships between structure performance and human biometrics. Accordingly, sensors may be used to quantify interaction between a human 118 and an as built structure 102A according to physiological and behavioral data, social interactions, environmental factors within the structure, actions undertaken, movements, and almost any quantifiable aspect.

As Built Features and biometrics may be further utilized to control various home automation devices. Home automation devices may include, by way of non-limiting example one or more of: automated locks or other security devices; thermostats, lighting, cooking, cleaning, bathing devices and the like. Accordingly, a house with recorded as built design features and vibration sensors may track activities in a home and determine that a first occupant associated with a first vibration pattern of walking is in the house. Recorded vibration patterns may indicate that person one is walking down a hallway and automatically turn on appropriated lighting and adjust one or more of: temperature, sound and security. Security may include locking doors for which person one is not programmed to access. For example, a first pattern of vibration may be used to automatically ascertain that a young child is traversing an area of a structure for which as built data has been collected. A door may be secured to prevent the young child from accessing certain rooms, such as a workshop, office or laundry room which may contain sensitive and/or dangerous items. Similarly, an elderly person suffering from dementia may be cordoned off away from a kitchen where they may turn on cooking devices, but be allowed into a family room to access entertainment and a bathroom. In some specific examples, an entertainment system may automatically play audio and/or video based upon proximity of a particular person as determined via the person's vibration in relation to as built data. Other home automation may be similarly deployed according to as built data, occupant profiles, biometric data, time of day, or other combination of available sensor readings.

Figure 2:
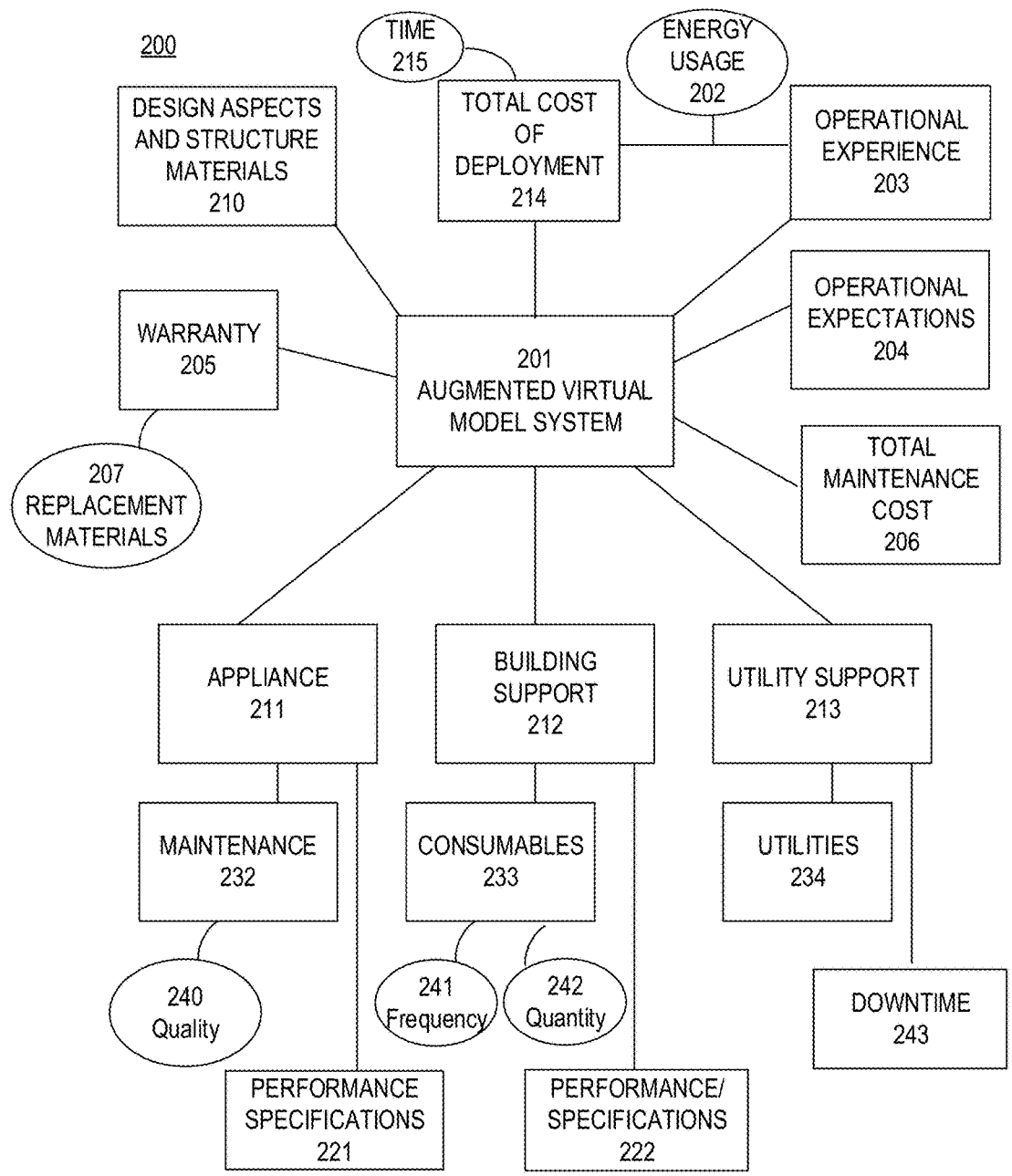
FIG. 2 illustrates a block diagram of an Augmented Virtual Modeling system.

Referring now to FIG. 2, a functional block illustrates various components of some implementations of the present invention. According to the present invention automated apparatus included in the Augmented Virtual Model System 201 are used to generate a model of a Virtual Residential Structure ("VRS") and may also incorporate a model and associated real estate parcel ("VRS"). One or more pieces of equipment that will be deployed in the Residential Property may be included into the virtual model, equipment may include, for example: appliances 222; building support items 212, and utilities support 213. The AVM may model expectations 204 of Performance of the residential structure and associated equipment. Appliances 211 may include, for example, one or more of: a washer, dryer, dishwasher, microwave, central vacuum, refrigerator, freezer, cooking range, oven, outdoor grill and the like. Building support items 212 may include one or more of: HVAC, vacuum unit, cable, sound, data network, alarm systems, image and/or audio monitoring system, security system, home automation, air purification systems and the like. Utility support may include cabling, dish antennas, Wi-Fi, water softener, water filter and the like.

The Augmented Virtual Model System 201 calculates a predicted Performance of the Virtual Residential Model and generates Operational Expectations 204 based upon the Performance, wherein "Performance" may include one or more of: total cost of operation; total satisfaction of operator's use an as built physical model based upon the Virtual Residential Model; and residual value of an as built following a term of years of occupation and use of an as built based upon the Virtual Residential Model generated by the Virtual Residential Structure System 201.

In another aspect, actual Operational Experience 203 may be monitored, quantified and recorded by the Augmented Virtual Model System 201. Data quantifying the Operational Experience 203 may be collected, by way of non-limiting example, from one or more of: Sensors incorporated into an as built structure; maintenance records; utility records indicating an amount of energy 202 (electricity, gas, heating oil) consumed; water usage; periodic measurements of an as built structure, such as an infra-red scan of climate containment, air flow through air handlers, water flow, water quality and the like; user surveys and maintenance and replacement records.

In still another aspect, a warranty 205 component, including one or both of parts and labor associated with an as built structure may be tracked, including replacement materials 207. The warranty 205 may apply to an actual structure, or one or more of appliances 211; building support item 212; and utility support item 213.

The Augmented Virtual Model System 201 may take into account a proposed usage of a deployment of a residential structure based upon values for deployment variables, and specify aspects of one or more of: Appliances 211; building support 212; and utility support 213 based upon one or both of a proposed usage and values for deployment variables. Proposed usage may include, for example, how many people will occupy a residential structure, demographics of the people that will occupy the residential structure; percentage of time that the residential structure will be occupied, whether the residential structure is a primary residence, whether the residential structure is a leased property and typical duration of leases entered into, environmental conditions experienced by the residential structure, such as exposure to ocean salt, Winter conditions, desert conditions, high winds, heavy rain, high humidity, or other weather conditions.

In another aspect, deployment may relate to biometrics or other data associated with specific occupants of a structure. Accordingly, in some embodiments, sensors may monitor biologically related variables of occupants and/or proposed occupants. The biometric measurements may be used to determine one or both of Lead Actions and Lag Metrics. Lead actions may include one or more of: use of specific building materials, selection of design aspects; deployment of structure equipment; deployment of appliances; terms of a lease; length of a lease; terms of a maintenance contract; and home automation controls.

According to the present invention, design aspects and structure materials 210 may also be based upon the proposed usage and values for deployment variables. For example, a thicker exterior wall with higher insulation value may be based upon a structures location in an adverse environment. Likewise a thicker interior wall with sound proofing may be specified in a structure designed for rental occupation and/or for housing active children. Accordingly, various demographic considerations and proposed usage of a structure may be used as input in specifying almost any aspect of a residential structure.

Total Cost of Ownership (TCO)

In still another consideration, a monetary value for one or more of: a total cost of ownership cost ("TCO"). Total maintenance cost ("TMC") and a desired return on investment ("ROI") for a Residential Property may be used as input for one or more design aspects included in an Augmented Virtual Model 100. Total Cost of Ownership, Total Maintenance Cost and ROI may be used to determine optimal values of variables 202-205, 210-213 specified in an Augmented Virtual Model 100 and incorporated into an as built structure, and other improvements to a real estate parcel.

A Total Cost of Ownership 214 may change based upon a time period 215 used to assess the Total Cost of Ownership 214. A ROI may include one or more of: a rental value that may produce a revenue stream, a resale value, a cost of operation, real estate taxes based upon structure specifications and almost any other factor that relates to one or both of a cost and value.

Desirable efficiency and Performance may be calculated according to one or more of: established metrics, measurement protocols and past experience. The Augmented Virtual Model System 201 and associated technology and software may be used to support a determination of a TCO. In another aspect, a TCO may be based upon an assembly of multiple individual metrics, procedures to assess metrics, procedures to adjust and optimize metrics and procedures to apply best results from benchmark operations. In the course of managing Total Cost of Ownership, in some examples, initial steps may include design aspects that model an optimal design based upon Total Cost of Ownership metrics and also model designed algorithms used to assess Total Cost of Ownership metrics.

In the following examples, various aspects of Total Cost of Ownership 214, Total Maintenance Costs, and associated metrics, are considered in the context of calculating a target Total Cost of Ownership 214. Accordingly, the AVM may be used to TCO optimization.

A designed residential structure is ultimately built at a site on a real estate parcel. A build process may be specified and provide metrics that may be used in a process designed by a Augmented Virtual Model System 201 and also used as a physical build proceeds. In some examples, time factors associated with a physical build may be important, and in some examples time factors associated with a physical build may be estimated, measured and acted upon as they are generated in a physical build process. Examples of time factors may include, one or more of: a time to develop and approve site plans; a time to prepare the site and locate community provided utilities or site provided utilities; a time to lay foundations; a time to build structure; a time to finish structure; a time to install internal utilities and facilities related aspects; a time to install, debug, qualify and release equipment; times to start production runs and to certify compliance of production are all examples of times that can be measured by various techniques and sensing equipment on a residential structure's site. Various time factors for a build are valuable and may become increasingly valuable as a physical build proceeds since the monetary investment in the project builds before revenue flows and monetary investments have clearly defined cost of capital aspects that scale with the time value of money.

Various build steps may include material flows of various types. Material flow aspects may be tracked and controlled for cost and efficiency. Various materials may lower a build materials cost, but raise time factors to complete the build. Logical variations may be calculated and assessed in an Augmented Virtual Model System 201 and optimal build steps may be generated and/or selected based upon a significance placed upon various benefits and consequences of a given variable value. Physical build measurements and/or sensing on physical build projects may also be used as input in an assessment of economic trade-offs.

The equipment deployed may incur a majority of a build cost depending upon user defined target values. The AVM may model and present alternatives including one or more of: cost versus efficiency, quality, time to build, life expectancy, market valuation over time. A cost to build may be correlated with cost to deploy and eventual resale. An overall model of a Total Cost of Ownership 214 may include any or all such aspects and may also include external. In some examples, the nature of equipment trade-offs may be static and estimations may be made from previous results. In some other examples, changes in technology, strategic changes in sourcing, times of acquisition and the like may play into models of Total Cost of Ownership 214.

In some examples, an initial efficiency of design which incurs large costs at early stages of a project may have a dominant impact on Total Cost of Ownership 214 when time factors are weighted to real costs. In other examples, the ability of a residential structure to be flexible over time and to be changed in such flexible manners, where such changes are efficiently designed may dominate even if the initial cost aspects may be less efficient due to the need to design in flexibility. As a residential structure is built, and as it is operated the nature of changing customer needs may create dynamic aspects to estimations of Total Cost of Ownership 214. Therefore, in some examples, estimates on the expected dynamic nature of demands on a residential structure may be modeled against the cost aspects of flexibility to model expectations of Total Cost of Ownership 214 given a level of change.

In some examples, factors that may be less dependent on extrinsic factors, such as product demand and the like may still be important metrics in Total Cost of Ownership 214. Included in the As Built factors may be calculations such as HVAC temperature load, in which personnel and seasonal weather implications may be important. AVM models may include a user interface to receive value useful in the AVM models. In addition, electronic monitoring, via Sensors that may determine energy consumption, includes for example: electricity, fuel oil, natural gas, propane and the like may be useful for estimation and measurement.

Temperatures may be monitored by thermocouples, semiconductor junction based devices or other such direct measurement techniques. In other examples, temperature and heat flows may be estimated based on photon based measurement, such as surveying the residential structure with infra-red imaging or the like.

Utility load may be monitored on a residential structure wide basis and/or at point of use monitoring equipment located at hubs or individual pieces of equipment itself. Flow meters may be inline, or external to pipes wires or conduits. Gases and liquid flows may be measured with physical flow measurements or sound based measurement. In other examples, electricity may be monitored as direct current measurements or inferred inductive current measurement.

In some examples, the nature and design of standard usage patterns of a residential structure and an associated environment may have relevance to Total Cost of Ownership. For example, usage that includes a larger number of ingress and egress will expose an HVAC system to increased load and usage that includes a significant number of waking hours with inhabitants in the residential building may incur increased usage of one or more of: appliances 211; building support devices 212; and utilities 234.

The nature and measurement aspects of vibration in the residential structure may also be modelled and designed as the residential structure is built. There may be numerous means to measure vibrations from capacitive and resistive based measurements to optical based measurements that measure a subtle change in distance scale as a means of detecting vibration. Vibration may result from a residential structure being located proximate to a roadway, train, subway, airport, tidal flow or other significant source of relatively consistent vibration. Vibration may also be more periodic, such as earthquake activity. In still another aspect, vibration may result from human traffic within the Residential Property. Still another aspect includes a type of human use of the Residential Property, which may range from a single elderly person with limited mobility to teenage children bouncing balls and rough housing, or the use of exercise videos that include loud music within the structure and significant human movement.

The use of vibration monitoring Sensors may indicate various activities that take place within the structure and facilitate more accurate modeling of a life expectancy of various aspects of the structure.

Noise levels are another type of vibrational measurement which is focused on transmission through the atmosphere of the residential structure. In some cases, noise may emanate from one location after moving through solid structure from its true source at another location. Thus, measurement of ambient sound with directional microphones or other microphonic sensing types may be used to elucidate the nature and location of noise emanations. In some cases, other study of the noise emanations may lead to establishment of vibrational measurement of different sources of noise. Floors, ceilings, doorways, countertops, windows and other aspects of a residential structure may be monitored in order to quantify and extrapolate noise levels. Noise and vibrational measurement devices may be global and monitor a region of a residential structure, or they may be inherently incorporated into or upon individual equipment of the residential structure.

In some examples, models of a residential structure (including original models and as built models) may include routings of pipes, wires, conduits and other features of a residential structure and the installed equipment that have structure. Together with models of the building structure and the equipment placed in the building the various routed structures may be married in a detailed Augmented Virtual Model 100.

In another aspect, an AVM 201 may include conflicts between the physical structures may be detected and avoided in the design stage at far improved cost aspects. In some examples, a designer may virtually ascertain a nature of the conflict and alter a design in virtual space to optimize operational aspects. Additionally, in some embodiments, an as built model may be generated during and after a residential structure is built for various purposes. In some examples, a technician may inspect a residential structure for conformance of the build to the designed model. In other examples, as an as built residential structure is altered to deal with needed changes, changes will be captured and included in the as built AVM 201.

In another aspect of the present invention, the AVM 201 may be used to generate a virtual reality model of a Residential Property, including one or more structures that may be displayed via user interface that includes an immersion of the user into a virtual setting. Immersion may be accomplished, for example, via use of a virtual reality headset with visual input other than a display screen is limited. In some embodiments, a virtual setting may be generated based upon a location of the user. For example, GPS coordinates may indicate a Residential Property and a user may wear a headset that immerses the user in a virtual reality setting. The virtual reality setting may display one or more virtual models of structures that may be potentially constructed on the Residential Property.

Embodiments may include models generated, standard modelling software such as BIM 360™ field which may support the display of a residential structure design in a very complete level of detail. Modelling of a residential structure in its location or proposed location, or in multiple proposed locations, may be useful from a Total Cost of Ownership perspective, especially from an evaluation of the nature of a site layout including real estate property parcel options and the like.

In some examples, a virtual display observed in the field at the site of an as built or proposed build may allow for design changes and design evaluations to be viewed in a space before build is completed. For example, a structure may be completed to the extent that walls, floors and ceilings are in place. A user may utilize a virtual display to understand the layout difference for different designs and the designs may be iterated from designs with the least flexibility to more flexible yet more complex designs.

In some examples, the design systems may include various types of features such as building structure, walls, ducts, utilities, pipes, lighting, and electrical equipment.

The design and modelling systems may be utilized to simulate and project cost spending profiles and budgeting aspects. The modelling systems may therefore be useful during the course of an audit, particularly when comparing actual versus projected spending profiles. The comparison of various spend sequencing may be used to optimize financing costs, maintenance, refurbishing and sequencing. The Augmented Virtual Model System 201 may be useful to provide early estimates, and for cost tracking versus projections which may be visualized as displays across a virtual display of the building, facilities and equipment.

Energy/Utilities Cost: There may be numerous examples of tradeoffs in sources of electric energy to a residential structure. For example, a site may be designed with various utility supplies for power, with tailored power management systems to balance the capacitance and impedance of the effective load to minimize electricity cost. In addition, various alternative forms of electric energy may be assessed and designed. Solar, geothermal and Wind generated electric power may make economic sense under certain conditions and may have time of day and seasonal relevance. The design of flexible support facilities for the installation of initial energy generation capacity with provision for the addition of additional capacity may be assessed. In some instances, backup power generation may be designed to ensure that a residential structure may run at some level for a certain period of time. In some cases, this may allow for continued production, in other examples, backup power may give a residential structure the time to idle and shut down capacity in a safer and less damaging manner.

In some examples, an energy source for heating, cooling, humidification and dehumidification equipment may be modelled and managed. In some examples, a source of energy used may be one or more of electric, natural gas, propane, fuel oil or natural gas. Emergency backup may also be modelled and managed. Various choices between electric sources. Solar and fuel based energy consumption may be modelled and controlled based on upon market forecasts. Estimates may be periodically adjusted according to world and/or market events.

Enhanced inspection, and guidance capabilities enabled via ongoing electronic Sensor measurements may facilitate one or more of: maintenance, expansion and optimization of residential structure features, operation Residential Property equipment and maintenance models. Ongoing monitoring via Sensor data collection also increases knowledge of machines and operations, or other useful capacities towards knowing the state of the residential structure.

Decisions related to maintenance of equipment and facilities may be important decisions that modelling and operational management systems support. The various cost elements that may go into modelling may include, for example, one or more of: a cost of consumables; life of replaced parts, nature of failures of different part types; manpower associated with planned and unplanned maintenance and expected and actual life of equipment Inside of a functional residential structure, augmented reality functions viewable in an AVM 201 including a Virtual Residential Model may be used to guide operators, surveyors, repair workers, or other individuals, through the residential structure. As one non-limiting example, a tablet, mobile device, or other small device with a screen, imaging, and other sensing capabilities may be used in an augmented reality fashion towards this function.

As described above, facing a mobile device towards an area in a residential structure and movement of the mobile device in a particular pattern may be used to ascertain a specific area of the residential structure for which AVM 201 data should be accessed. A combination of one or more of: image, location, orientation, and other Sensors may also be used to identify to the mobile device, which wall segment, building aspect, appliance or equipment the device is identifying. A location of mobile device, a height and an angle of view may also be utilized to determine aspects of the structure for which a virtual model is being requested.

In some embodiments, a user may be presented with various layers of data, including, for example, one or more of: structural aspects of the residential structure, plumbing, electrical, data runs, material specifications or other documentation, including but not limited to: basic identifying information, installation information, service records, safety manuals, process records, expected service schedule, among many other possibilities.

A plurality of information may be thus easily accessible inside the residential structure, and may be used for a variety of functions, including finding a specific machine to then diagnose and service a problem, regular inspection of equipment, guided tours of the residential structure, or many other functions. This information may be conveyed to the individual in a plurality of possible formats, such as lists that show up on the screen, clickable icons that show up next to the equipment in a Virtual Reality ("VR") camera feed, or many other possibilities. These functions may also be accessible in a hands-free VR format with a VR headset, or other such device.

As the user is inside a residential structure, the user may receive a plurality of information, instructions, etc. while the user is proximate to the various aspects of the structures. For example, the user machines themselves, seeing them work, hearing the sounds they make, etc. to better inspect or service, among other possible functions, the residential structure's equipment. With VR systems, similar travel, guidance, or inspection capabilities for a functional residential structure may be achieved completely remotely from the residential structure itself. Additionally, with VR systems, these capabilities may occur prior, during, or after the construction or operation of a residential structure.

A VR system may constitute a headset or lens system with stereoscopic viewing capabilities, a sound conveying means, such as headphones, and various forms of user input, such as a handheld controller or foot pedals as non-limiting examples. Various forms of imaging, surveying, or modeling technology may be used to generate virtual models of a functional residential structure. As a non-limiting example, exploring such a model with a VR system may be used to examine layout, functioning, or other parameters of a residential structure before its construction. As an alternative non-limiting example, exploring a model possibly generated by sensing technology in real time, or over a period of time prior to viewing with a VR system, may allow for inspection or demonstration capabilities in a location entirely remotely from the actual residential structure itself. This may include both imagery and sounds captured within the residential structure.

Collection of data may additionally include actual service life experienced and performance of equipment used in an AVM which thereby enables enhanced modeling of a life expectancy of equipment included in an Augmented Virtual Model 100 and an as built structure. Various Sensors may gather relevant data related to one or more of: use of appliances and equipment, performance of appliances items of equipment and an ambient environment inside or proximate to appliances and equipment. In addition, an unstructured query relating to the functioning or life expectancy of equipment may be generated by a processor to access and interpret data, thereby deriving relevant input to a decision maker based upon analysis of the data.

Various examples of data to be acquired, relating to life expectancy of equipment, may include, but is not limited to, hours of operation, conditions of operation (whether and how long the equipment may be running under capacity, at rated capacity, or over capacity), or many environmental conditions for operation; environmental conditions may include the ambient temperature (or the difference in ambient temperature from an ideal or other measured value), ambient humidity (or the difference in ambient humidity from an ideal or other measured value), ambient air particulate content (or a comparison of the current air particulate level to a filter change schedule), presence or concentration of ambient gasses (if relevant) such as carbon dioxide, or other gas, a number of times of ingress or egress into the residential structure which may change ambient conditions or other trackable data.

Identification of Equipment

Identification capabilities may be facilitated or improved for one or more of: structural aspects, appliances, equipment and utility support within the residential structure. This identification may take many forms through various means of query and communication, and may be facilitated through various hardware and/or software means.

Non-limiting examples may include image based identification; a device with some imaging means, including but not limited to a mobile device camera, tablet device camera, computer camera, security camera, or AR headset camera may image the equipment to be identified. Image recognition software may be used to identify the visualized equipment by its identifying features. Machine learning may be used to train systems using this software to identify specific features of the equipment in question. Other types of visual identifiers including but not limited to QR codes, may be used to visually identify equipment.

An additional non-limiting example may include location based identification; a device with some location means, including but not limited to GPS, internal dead-reckoning, or other means, may be used to determine a location within a residential structure. Identifying information for equipment at or near the measured location may be accessed for assessment, based on its proximity to the location based signal.

An additional non-limiting example may also include direction based identification; with a fixed location, or in tandem with a location means, a device may have capabilities to deduce orientation based information of the device. This orientation information may be used to deduce a direction that the device is pointing in. This direction based information may be used to indicate that the device is pointing to a specific piece of equipment that may be identified.

An additional non-limiting example may also include as built sensor and sensor generated experiential data based identification; identifying information for various equipment may be stored and accessed within a database storing this information. This information may be accessed by various means by a user with certain qualification to that information.

An additional non-limiting example may include tag based identification; identifying information for various equipment may be accessed through proximity to many non-limiting examples of tagging capabilities, such as magnetic tags, bar code tags, or others. These tags may contain the information in question, or may reference the location of pertinent information to the owner, in order to convey this information to the owner.

An additional non-limiting example, data aggregation may include sensors generating data that is associated with an IoT (Internet of Things) based identification. Various IoT devices (or Sensors) may include a digital storage, processor and transmitter for storing and conveying identifying information. Upon request, an IoT device may relay identifying information of itself to a human with a communicating device, or to its neighbors. It may also possibly convey information received from and/or sent to other internet connected devices as well.

Data aggregated and stored for reference in calculation of Cost of Upkeep considered in a TOC and may include data related to some or all of:
  Documented items covered;
  Long term warranty for residential structure/building ownership;
  Items included in purchase price;
  financed amounts;

Tax implications;
Capital value;
Ability to expand residential structure and/or structural features such as baths or kitchens;
Lateral dimensions;
Vertical dimensions;
Building support systems;
Utilities;
Electric;
Water;
Discharge;
Aggregate Data;
Same residential structure;
Multiple similar facilities;
Disparate residential structure types;
Same geographic area;
Disparate geographic areas;
Locating Appliances and Equipment;
GPS (may be used in combination with other location technologies;
Near field communication with reference point emitter in residential structure;
Wi-Fi;
RFID;
Reflector tags;
"visual" recognition identifiers, i.e. hash, barcode; and
Directional—accelerometers in combination with visual recognition identifiers.

As per the above listing, functionality may therefore include modeled and tracked Performance of a residential structure and equipment contained within the residential structure, including consumables 233 used and timing of receipt and processing of consumables; modeled and actual maintenance 232, including quality of maintenance performed; equipment Performance including yields; Consumables 209 tracking may include a frequency of replacement and quantity of replaced consumables; Utilities 234 tracking may include projected and actually units of energy consumed.

3D Scanning & Model Development

In one aspect of the present invention data related to the position and identity of substantial elements of a residential structure are first designed and then recorded in their actual placement and installation. This may include locations of building features, such as beams, walls, electrical junctions, plumbing and etc. as the structure is designed and constructed. As part of the residential structure model, laser scanning may be performed on site at various disparate times during construction. An initial scan may provide general information relating to the location of the structure in relationship to elements on the property such as roadways, utilizes such as electricity, water, gas and sewer to identify non-limiting examples.

Additional events for scanning may occur during the construction process in order to capture accurate, three-dimensional (3D) "as-built" point cloud information. Point cloud may include an array of points determined from image capture and/or laser scanning or other data collection technique of as built features. As non-limiting examples, the following home information may be captured via the laser scan and subsequently compared to a design model and an "as built" model. In some examples, captured data may be converted into a 3D model, and saved within a cloud-based data platform.

In some examples other methods of capturing spatially accurate information may include the use of drones and optical scanning techniques which may include high resolution imagery obtained from multiple viewpoints. Scanning may be performed with light based methods such as a CCD camera. Other methods may include infrared, ultraviolet, acoustic, magnetic and electric field mapping techniques may be utilized.

Residential structure related information may include physical features generally associated with an exterior of a structure such as geo-location, elevation, surrounding trees and large landscaping features, underground utility locations (such as power, water, sewer, sprinkler system, and many other possible underground utility features), paving, and pool or patio areas. Residential structure related information may also include features generally related to a structure such as underground plumbing locations, stud locations, electrical conduit and wiring, vertical plumbing piping, and HVAC systems or other duct work. The acquisition of the data may allow the model system to accurately locate these interior and exterior features. Acquisition of as built data during different points of the construction completion allows measurements to be taken prior to aspects involved in a measurement process being concealed by concrete, sheetrock or other various building materials.

Data is acquired that is descriptive of actual physical features as the features are built and converted into a 3D model which may be referred to as the "as built" model. The as built model will include "key components" of the structure and be provided with a level of artificial intelligence that fully describes the key component. In some embodiments, the as built model may be compared to a design model. In some implementations "intelligent parameters" are associated with key components within the 3D model. For example, key components and associated information may further be associated with intelligent parameters. Intelligent parameters for the key components may include the manufacturer, model number, features, options, operational parameters, whether or not an option is installed (and if so, its features and dimensions), any hardware associated with the key component (and its manufacturer and serial number), an owner's manual and service contract information, as non-limiting examples. Intelligent parameters associated with a functional key component such as, HVAC Equipment, may include the manufacturer, model number, capacity, efficiency rating, serial number, warranty start date, motor size, SEER rating, an owner's manual associated with the equipment, and service contract information.

Key components of the home may have an identification device such as a two or three dimensional graphical code (such as a QR code label) a Radio Frequency Identification Chip (RFID) attached that is accessible to a user, such as a home owner, home builder or service technician. When scanned with an apparatus capable of reading the code, a user interface on a display of various types, such as a tablet, may use the associated identification, such as a QR code, to provide direct access to related information. In some examples, the display may show textual or tabular representations of related data.

In other examples, graphical data such as images, drawings, and the like may be displayed. In still further examples, both graphical and textual displays may be associated with the code. Although a QR code may provide an example, other identification technologies such as radio frequency ID, Internet of things (IoT) communication protocols with associated stored information, and other devices that can receive a signal and respond with stored information may be used. As well, numerous other types of graphical codes in addition to QR code may be read by a device and provide a connection between a key component, appliance, location or other identified aspect and associated data. In some examples, the image based code may be displayed using paints or pigments which are not visible to the human eye, such as in a non-limiting example ultraviolet pigments. In some other examples, a paint or pigment may not be visible until it is made to emit visible light by irradiating it with a particular band of electromagnetic radiation, such as, for example, ultraviolet light.

In some examples, key components may include doors, windows, masonry, roofing materials, insulation, HVAC equipment, water heaters, range, dishwasher, microwave, garbage disposal, garage door/opener, pool equipment, and the like.

An automated Residential Design and Monitoring ("RDM") system may support dynamic updating of tracked aspects. For example, as a home owner acquires new or additional key components, such as appliances (refrigerators, a clothes washer/dryer, a water softener as non-limiting examples), HVAC, plumbing additions and pools, key components may be added into the as built model and the key components may be tracked as a part of the model. Other aspects may be dynamically updated such as when additions are made to the building structure or rebuilding of internal structure is made as non-limiting examples.

Since the as built model includes information in a database and dynamic model functionality exists that commences as a building structure is being constructed, the model may assume new support aspects to the construction process itself. For example, a benefit from the definition and utilization of many components within a residential structure utilizing the system herein includes the ability to pre-cut and/or pre-fabricate studs and framing, roofing cuts, masonry, under-slab plumbing, HVAC ductwork, electrical, and other such components. The dimensions of these various components may be dynamically updated based on an original model that may be compared to actual fabricated structure as realized on a building site. In some examples a home builder may use a display interface associated with the system and model to display a comparison of an original set of building plans to a current structure at a point in time which may allow the builder to authorize any structural changes or variances to design and thereafter allow the description of following components to be dynamically adjusted as appropriate. The system may be of further utility to support various inspections that may occur during a building project which may associate detected variances with design expert review and approval. An inspector may be able to utilize the system as allowed on site or operate a window into the system from a remote location such as his office.

As the system is utilized during construction, orders for customized components may be placed. These customized components may be labeled and delivered to site, in an appropriate sequence, for assembly by carpenters. This may contribute to a minimization of waste at the worksite, as well as provide a work product that is entirely consistent with a pre-determined model which may have approved changes that are tracked. The result may improve the quality of the work product, and make it easier to generate the measured point-cloud 3D model.

Performance Tracking

In another aspect, the RDM system can autonomously and/or interactively obtain, store and process data that is provided to it by components of the residential structure as the structure is built, installed or additions are made to the structure. The generation, modeling, capture, use, and retention of data relating to Performances in specific equipment or in some cases aspects relating to the design of a facility, may be monitored by the system.

In some examples, Operational Performance may be assessed by processing sampled data with algorithms of various kinds. Feedback of the status of operation and of the structure as a whole or in part, as assessed by algorithmic analysis may be made to a home owner or a home builder. In addition, a variety of data points gathered via appropriate Sensors, visual and sound data may be recorded and stored and correlated to 3D models of the facility. Experiential Sensor readings may include, by way of non-limiting example: temperature, power usage, utilities used, consumables, product throughput, equipment settings, and equipment Performance measurement, visual and audible data. Techniques to record data points may involve the use of one or more of: electronic Sensors, electro-mechanical Sensors, CCD capture devices, automated inspection equipment, video camera arrays and audio microphones and arrays of audio microphones for the capture and processing of data that may be used to generate visualizations of actual conditions, either on site or at a remote location. In addition, data may be collected, retained, analyzed, and referenced to project facility Performance.

In some examples, data may also be combined with manufacturer equipment specifications and historical data to model expectations related to actual operation of the structure and property aspects. In still additional examples, Virtual Maintenance Support A 3D model of structure, such as a residential home, which may be integrated with information related to the key components and laser scanned location information, may be made available to the home owner/home builder through a computer, an iPad or tablet, or even a phone. The resulting system may be useful to support virtual maintenance support.

The three dimensional model may support enhancement to the two dimensional views that are typical of paper based drawings. Although three dimensional renderings are within the scope of information delivered in paper format, a three dimensional electronic model may render dynamic views from a three dimensional perspective. In some examples, the viewing may performed with viewing apparatus that allows for a virtual reality viewing.

In some examples, a viewing apparatus, such as a tablet or a virtual reality headset, may include orienting features that allow a user such as a home owner, home builder, inspector, engineer, designer or the like to view aspects of a model based upon a location, a direction, a height and an angle of view. A current view may be supplemented with various other information relating to features presented in the view. In some examples, the interface may be accessible through a virtual reality headset, computer, or mobile device (such as an iPad, tablet, or phone), as non-limiting examples. Utilizing one of these possible devices equipped with accelerometers, such as a virtual reality headset or mobile device, as non-limiting examples, a viewable section of the model may be displayed through the viewing means (whether on a screen, or through viewing lenses), where the viewer's perspective changes as the accelerometer equipped device moves, allowing them to change their view of the model. The viewer's Vantage Point may also be adjusted, through a certain user input method, or by physical movement of the user, as non-limiting examples.

The presented view may be supplemented with "hidden information", which may include for example, depictions of features that were scanned before walls were installed including pipes, conduits, ductwork and the like. Locations of beams, headers, studs and building structure may be depicted. In some examples, depiction in a view may include a superposition of an engineering drawing with a designed location, in other examples images of an actual structure may be superimposed upon the image based upon as built scans or other recordations.

In a dynamic sense, display may be used to support viewing of hypothetical conditions such as rerouted utilities, and rebuild walls and other such structure. In some examples, graphical or text based data may be superimposed over an image and be used to indicate specifications, Performance aspects, or other information not related to location, shape and size of features in the image.

As presented above, an image may allow for a user to "see through walls" as the augmented reality viewing device simulates a section of a model associated with a space displayed via the virtual reality viewing device. The viewer's perspective may change as an accelerometer in the virtual reality viewing device moves. A user may also change their view of the model, to include different layers of data available in the model. The viewer's Vantage Point may also be adjusted by moving about the physical space that is represented by the model. To achieve this, it may be possible to incorporate positioning hardware directly into the building represented by the virtual model. The positioning hardware may interface with an augmented reality device for positioning data to accurately determine the viewing device's orientation and location with millimeter precision. The positioning hardware may include, for example a radio transmitter associated with a reference position and height. Altitude is differentiated from height unless specifically referenced since the relative height is typically more important.

Accordingly, a user may access the AVM on site and hold up a smart device, such as an iPad or other tablet, and use the smart device to generate a view inside a wall in front of which the smart device is positioned, based upon the AVM and the location, height and direction of the smart device position.

In some examples, through the use of an augmented reality device, it may also be possible to view data, such as user manuals, etc. of associated devices in the view of a user, simply by looking at them in the viewing interface. In other examples, there may be interactive means to select what information is presented on the view.

Various electronic based devices implementing of the present invention may also be viewed in a virtual reality environment without accelerometer such as a laptop or personal computer. A viewable section of a model may be displayed on a Graphical User Interface (GUI) and the viewer's Vantage Point may be adjusted, through a user input device.

The ability to track appliances and other components of a residential system and store the components associated information, such as, for example user manuals and product specifications and part numbers, may allow for much more efficient use and maintenance of the components included within a structure. As well, the system model may also maintain home owner manuals and warranties and eliminate the need for storage and tracking of hard copy manuals.

In a non-limiting example, if a home owner/home builder desires information related to an appliance, it may be found by positioning a device with a location determining the device within it in proximity to the appliance and accessing the parallel model in the Virtual Residential Structure such as by clicking on the appliance in the Virtual Residential Structure model or by scanning the Code label attached to the dishwasher itself. In some examples, an internet of things equipped dishwasher may have the ability to pair with a user's viewing screen and allow the system model to look up and display various information. Thus, the user may have access to various intelligent parameters associated with that appliance such as service records, a manual, service contract information, warranty information, consumables recommended for use such as detergents, installation related information, power hooked up and the like.

In some examples, the system may include interfaces of various kinds to components of the residential system. Sensors and other operational parameter detection apparatus may provide a routine feedback of information to the model system. Therefore, by processing the data-stream with various algorithms autonomous characterization of operating condition may be made. Therefore, the model system may provide the home owner/home builder with alerts when anomalies in system Performance are recognized. In some examples, standard home maintenance requirements may be sensed or tracked based on usage and/or time and either notification or in some cases scheduling of a service call may be made. In some examples, the alert may be sent via text, email, or both. The home user may, accordingly, log back into the Virtual Residential Structure to indicate completion of a maintenance task; or as appropriate a vendor of such service or maintenance may indicate a nature and completion of work performed.

By detecting operational status, a Virtual Residential Structure may take some additional autonomous steps to support optimal operation of a residential system. In some examples, a Virtual Residential Structure may take steps to order and facilitate shipping of anticipated parts needed for a scheduled maintenance ahead of a scheduled date for a maintenance event (for example, shipping a filter ahead of time so the filter arrives prior to the date it is scheduled to be changed). In another example, a Virtual Residential Structure may recall notes from an Original Equipment Manufacturer (OEM) that could be communicated to a user through the Virtual Residential Structure. In still further examples, Virtual Residential Structure may support a user involved in a real estate transaction by quantifying service records and Performance of a real property.

Some examples of home builder or rental company related opportunities for using the model system may include allowing home builders to establish a standard maintenance and warranty program based on manufacturers published data and the ability to advise home owners of upcoming needs and/or requirements. In other examples, the model system may facilitate allowing for home builders, rental companies, or maintenance companies to consolidate information for volume discounts on parts or maintenance items. The model system may also facilitate minimizing unnecessary time expenditure for home builders hoping to minimize needless service calls for warranty issues, and allowing home builders and rental companies attempting to sell a home or a rental to demonstrate that care has been taken to maintain a home.

Benefits derived from monitoring and tracking maintenance with a Virtual Residential Structure may include positively reassuring and educating lenders and/or lien holders that their investment is being properly cared for. In addition, insurance companies may use access to a Virtual Residential Structure to provide factual support that their risk is properly managed. In some examples, a data record in a Virtual Residential Structure model system and how an owner has cared for their residential facility may be used by insurance companies or lenders to ensure that good care is being taken. Maintenance records demonstrating defined criteria may allow insurance companies to offer a home owner policy discount, such as, for example, installation of an alarm system. Additionally, access to a Virtual Residential Structure may allow municipalities and utilities to use the info for accurate metering of utility usage without having to manually check; and peaks in utility demand may be more accurately anticipated.

In some examples, Virtual Residential Structure may also be used to assist with home improvement projects of various types. In some examples, the home improvement projects may include support for building larger additions and modifications, implementing landscaping projects. Smaller projects may also be assisted, including in a non-limiting example such a project as hanging a picture, which may be made safer and easier with the 3D "as-built" point cloud information. Hidden water piping, electrical conduits, wiring, and the like may be located, or virtually "uncovered", based on the model database.

Optimization of Residential Facilities

During construction of a structure corresponding to a Virtual Residential Structure, discrete features of the as built structure may be identified via an identification device such as an IoT device or a QR code label. The ID device may be integrated to the feature or added during the build scope. Performance monitors may also be simultaneously installed to allow monitoring of Key Performance Indicators (KPIs) for selected features. In an example, an HVAC system may be added to a residential facility during construction and a simultaneously a Performance monitor may be added to the HVAC system. The Performance monitor may be used to monitor various KPIs for an HVAC system. These KPIs may include outdoor air temperature, discharge air temperature, discharge air volume, electrical current, and the like. Similar monitoring capabilities may be installed to all appliances and utilities systems in a residential facility. The combination of these numerous system monitors may allow for a fuller picture of the efficiency of operations of various systems.

Use of the Virtual Residential Structure, which may include data values contributed from communication of data from the various monitoring systems, may allow owners to receive periodic reports, such as in a non-limiting sense monthly emails which may show their current total energy consumption as well as a breakdown of what key components are contributing to the current total energy consumption.

The systems presented herein may be used by owners and facility managers to make decisions that may improve the cost effectiveness of the residential system. An additional service for Owners may allow the homeowner to tap into energy saving options as their home ages. As an example, if a more efficient HVAC system comes on the market, which may include perhaps a new technology node, the Owner may receive a "Savings Alert". Such an alert may provide an estimated energy savings of the recommended modification along with an estimate of the cost of the new system. These estimates may be used to generate a report to the owner of an estimated associated return-on-investment or estimated payback period should the home owner elect to replace their HVAC system.

In some examples, a home owner could use the Virtual Residential Structure to set a threshold value for the required ROI above which they may be interested in receiving such an alert with that ROI is achieved. This information will be based on data derived from actual operating conditions and actual historical usage as well as current industry information. Predictive maintenance and energy savings to key systems via Smart Home Total Cost of Ownership ("TCO") branded Sensors.

Aggregating Data from Multiple Residences

With the ability to collect and utilize relevant home information with the model system, the aggregation of data and efficiency experience from numerous residential systems may allow for analysis of optimization schemes for various devices, appliances and other home components that includes real installed location experience. Analysis from the aggregated data may be used to provide feedback to equipment manufacturers, building materials fabricators and such suppliers.

In some examples, business models may include providing anonymous and aggregated data to original equipment manufacturers as a service model to give the OEMS an ability to utilize more data to monitor and improve their products. In some examples, OEM advertising may be afforded access through the model system. Manufacturers may have an additional side benefit motivating the use of this data related to improving their equipment cost effectives and reliability in order to minimize warranty cost. Such optimized Performance may also provide benefits to both home owners and builders to support their ability to track actual warranty information, power cost, and overall Performance of a home.

Methods and Apparatus

Figure 3A:
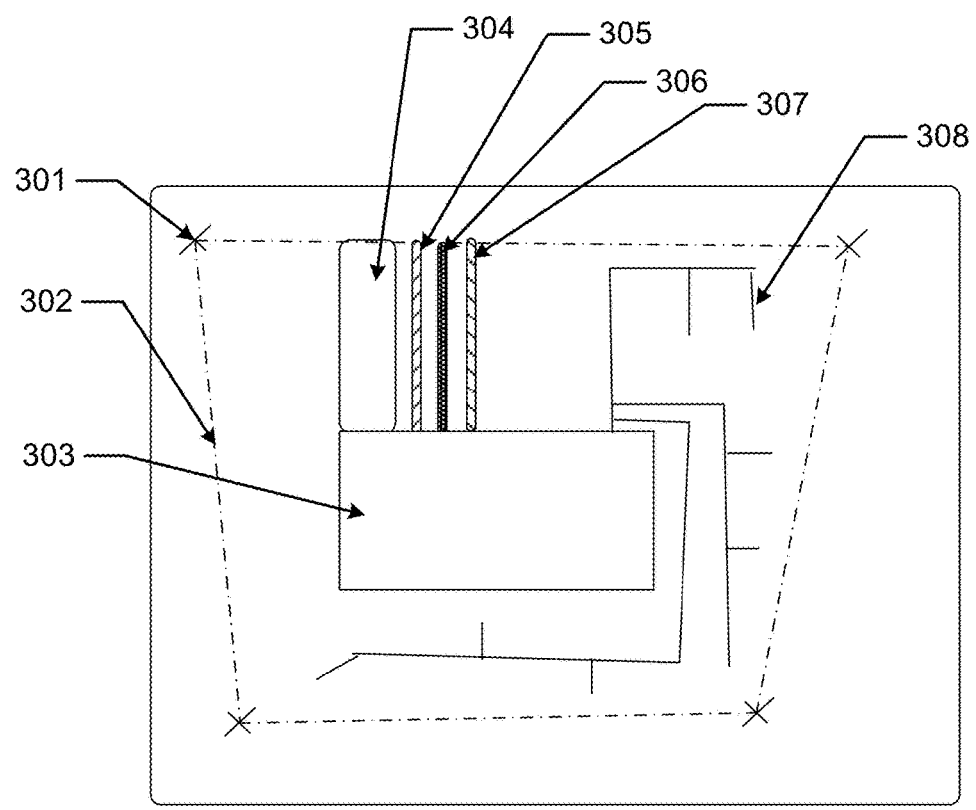

Referring to FIGS. 3A-3F, an illustration of the collection of data by scanning a residential facility during its construction is provided. In FIG. 3A, a depiction of a site for building a residence is illustrated. The depiction may represent an image that may be seen from above the site. Indications of property boundaries such as corners 301 and property boarders 302 are represented and may be determined based on site scanning with property markings from site surveys or may be entered based on global coordinates for the property lines. An excavated location 303 may be marked out. Roadways or driveways 304 may be located. Buried utilities such as buried telephone 305, buried electric 306, buried water and sewer 307 are located in the model as illustrated. In some examples, such other site service as a buried sprinkler system 308 may also be located.

Figure 3B:
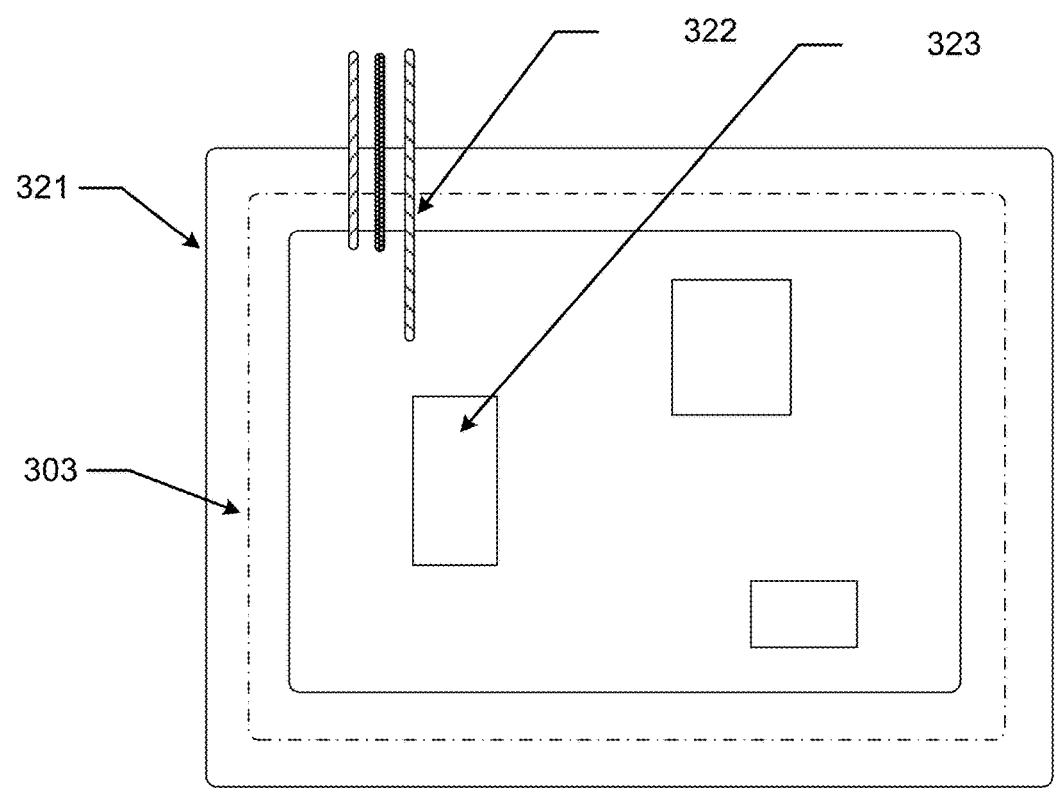

Referring to FIG. 3B the excavated location 303 may be scanned or imaged to determine the location of foundation elements. In some non-limiting examples, a foundational footing 321 along with buried utilities 322 is illustrated. The buried utilities may include such utilities as electric lines, water supply whether from a utility or a well on location, sewer or septic system lines, telecommunications lines such as telephone, cable and internet. Other footing elements 323 may be located at structural requiring locations as they are built. In some examples a scanning system may provide the locational orientation relative to site orientation markings. In other examples, aerial imagery such as may be obtained with a drone may be used to convert features to accurate location imagery.

Figure 3C:
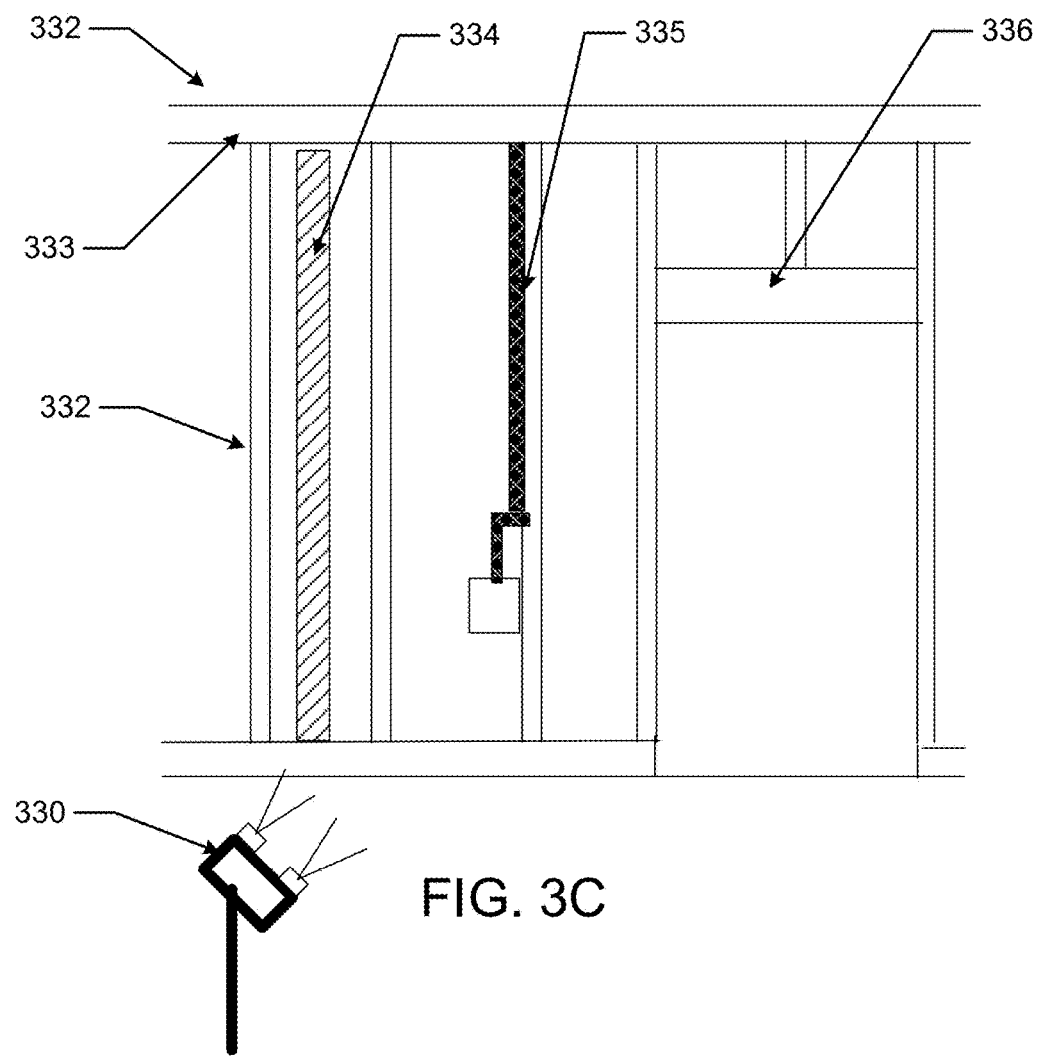

Referring to FIG. 3C a wall 331 of the residential structure in the process of build is illustrated. The structure may be scanned by a scanning element 330. In some examples, a laser three dimensional scanner may be used. The wall may have supporting features like top plates 333, headers 336, studs 332, as well as internal items such as pipes 334, electrical conduits and wires 335. There may be numerous other types of features within walls that may be scanned as they occur such as air ducts, video cables, telephone cables, and the like.

Referring to FIG. 3D the wall may be completed where the structure behind wall facing 340 may no longer be visible. Electrical outlets 341 and door structures 342 may be scanned by a scanning element 330.

Figure 3E:
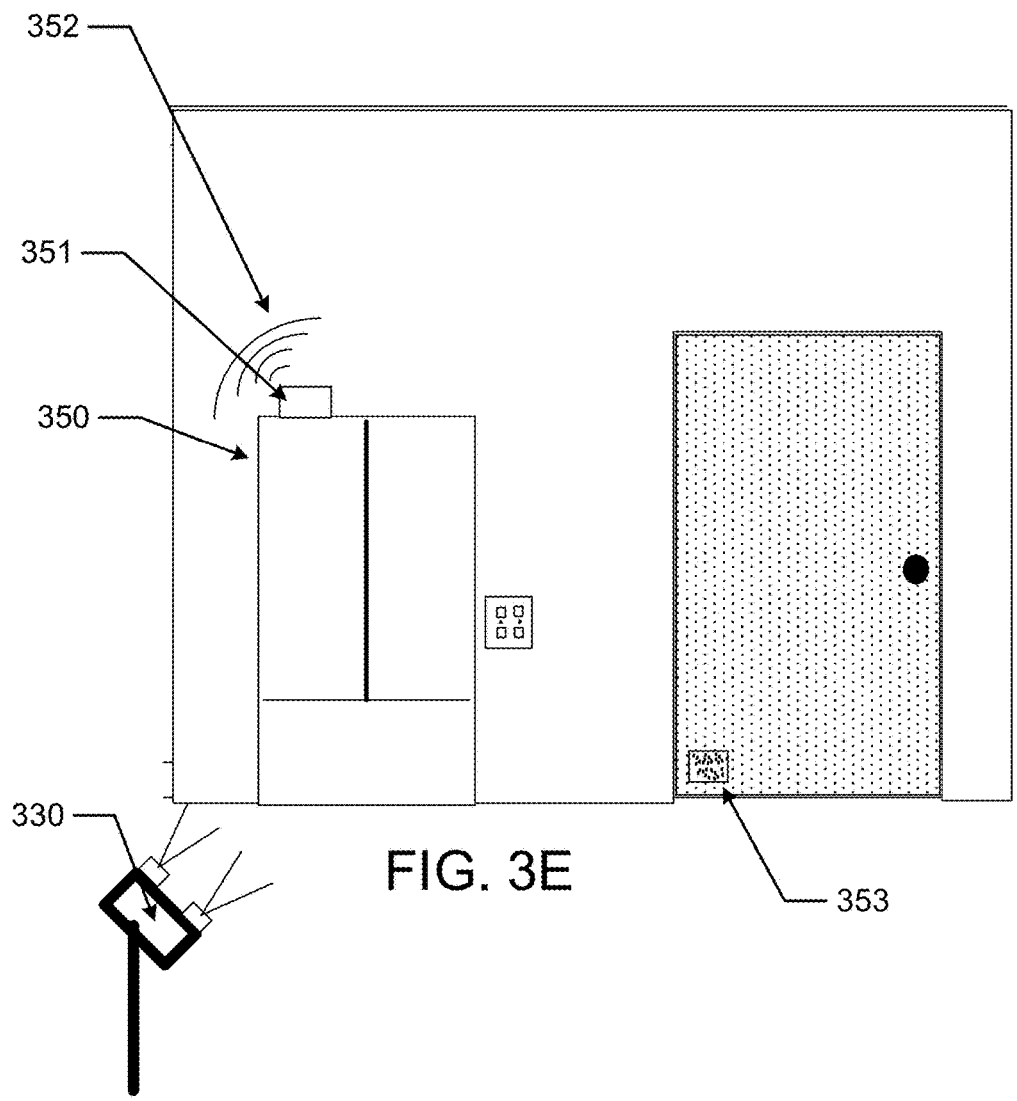

Referring to FIG. 3E internal components such as appliances may be installed. As a non-limiting example, a refrigerator as an appliance 350 may be installed and the resulting three dimensional profiles may be scanned by a scanning element 330. In some examples, an operational monitor 351 may be attached to the appliance. In some examples, an operational monitor may be part of the appliance. The operational monitor may have the ability to communicate 352 data to various receivers that may be connected to the model system of the residence. In some examples, key structural components, such as doors, may have identifying devices such as a QR label 353. The label may be visible or painted into the structure with non-visible paint. The identifying devices may provide information related to the device itself and warrantees of the device as non-limiting examples.

Figure 3F:
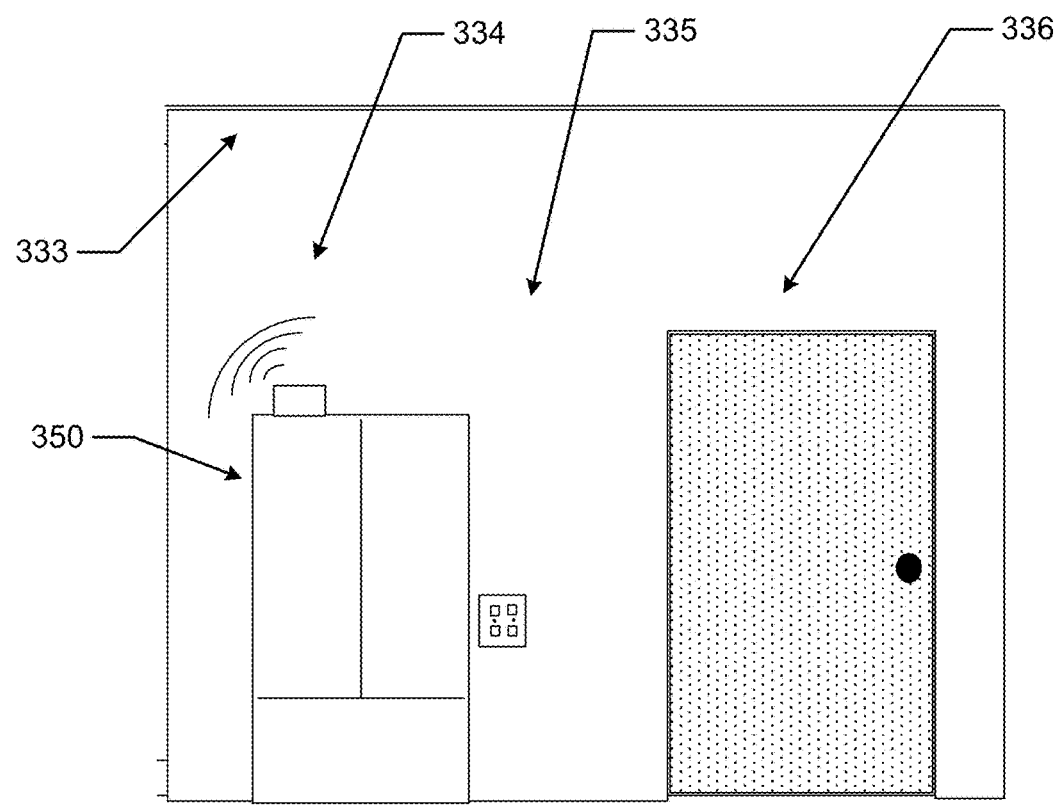

The model may include the various structure elements hidden and visible and may be used to create output to a display system of a user. Referring to FIG. 3F an example display is illustrated. The various non-visible layers may be shown by rendering the covering layers with a transparency. Thus the display shows the refrigerator profile 350 as well as the internal features that may be concealed like pipes 334, electrical conduits with wires 335, and headers 336 as examples.

Figure 3G:
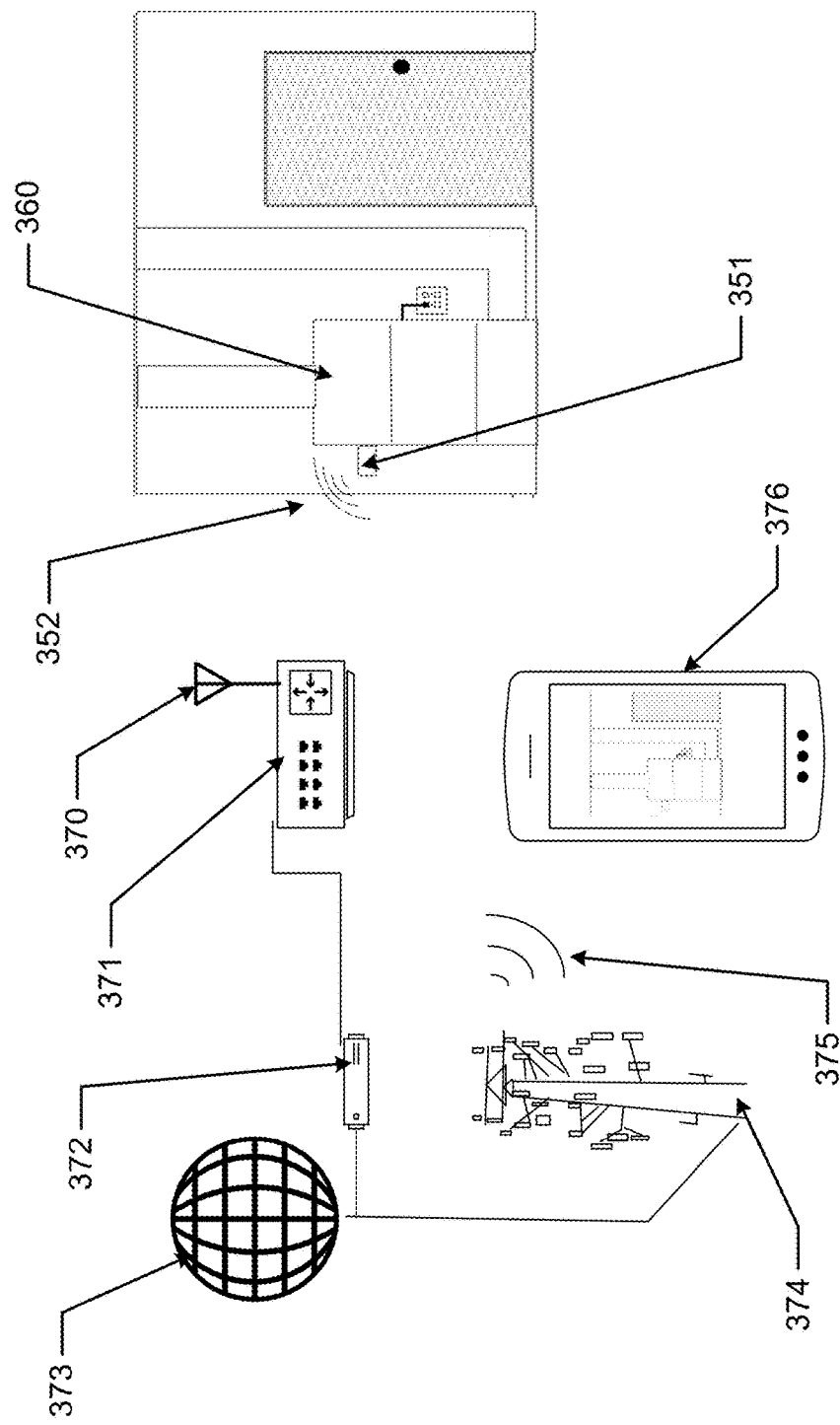
FIG. 3G illustrates an exemplary key component of the model system, wherein an HVAC unit is illustrated with a Performance monitor providing data to a communication system to the model system and ultimately to a display of the user.

Referring to FIG. 3G, an illustration of feedback of the model system is illustrated. A wall that has been scanned with an HVAC unit 360 may include a Performance Monitor 351 which may communication various information wirelessly 352. The communication may be received at an antenna 370 of a router 371 within the residential facility. The residential facility may be interconnected through the internet 372 to a web located server 373 which processes the communication. The web located server 373 also can include the various model data about the residential facility and it can provide composite displays that can summarize the structure as well as the operational Performance of the HVAC unit 360. It may aggregate the various data into textual and graphic reports. In some examples it may communicate these reports back through internet connections. In other examples, wireless Smart Device communications may be sent to cellular towers 374 which may transmit 375 to a Smart Device 376 of a user associated with the residential facility.

Figure 3H:
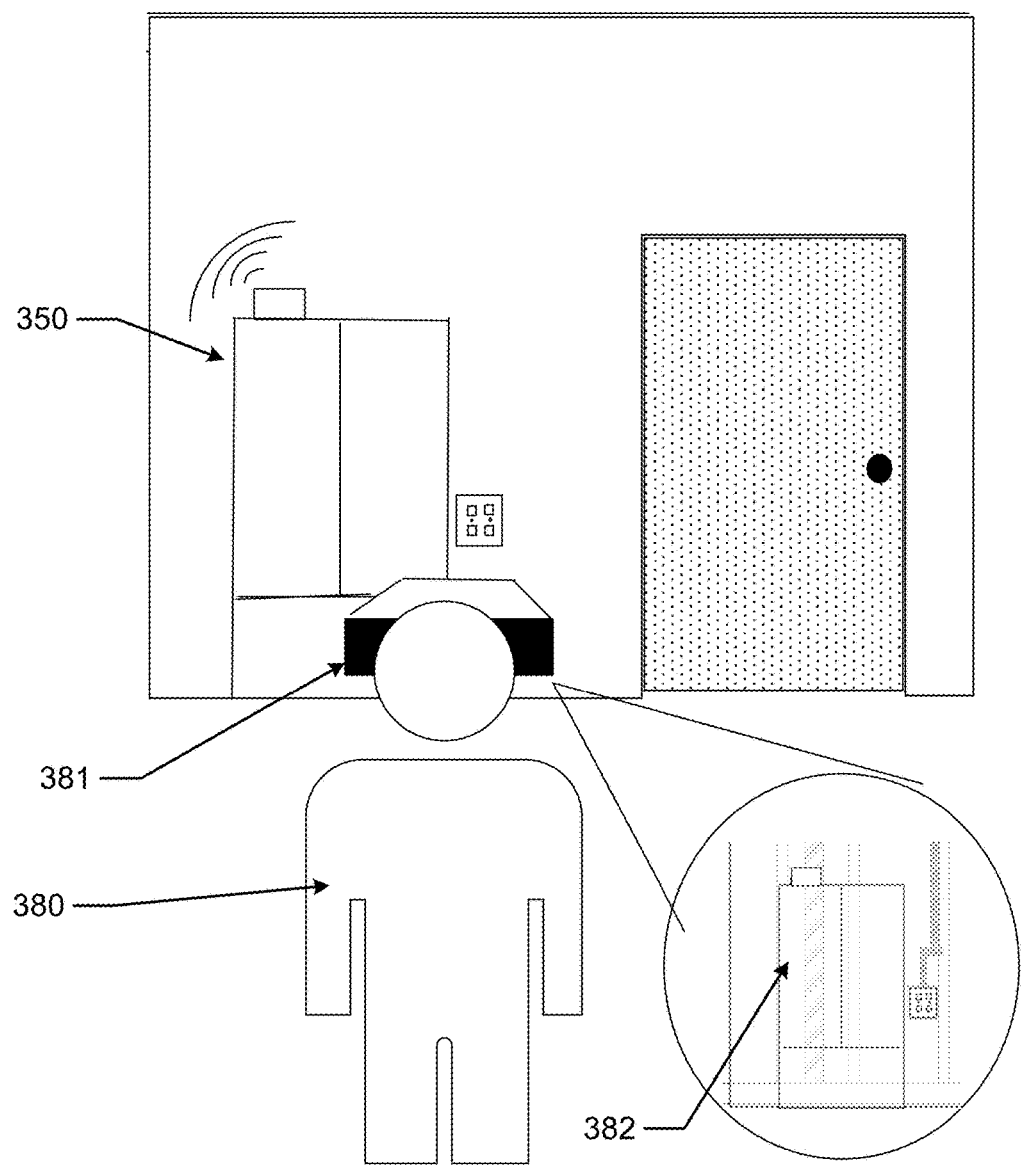
FIG. 3H illustrates an exemplary virtual reality display in concert with the present invention.

Referring to FIG. 3H an illustration of a virtual reality display in concert with the present invention is illustrated. An appliance 350 of the residential facility may communicate information to the model server. A user 380 may receive may an integrated communication from the server. The resulting communication may be provided to a virtual reality headset 381. The virtual reality headset may provide a display 382 to the user that provides a three-dimensional view of the physical data as well as simulated imagery that may allow views through objects to hidden elements behind the object. As well, a heads up type display of information about an object may be superimposed.

Figure 4A:
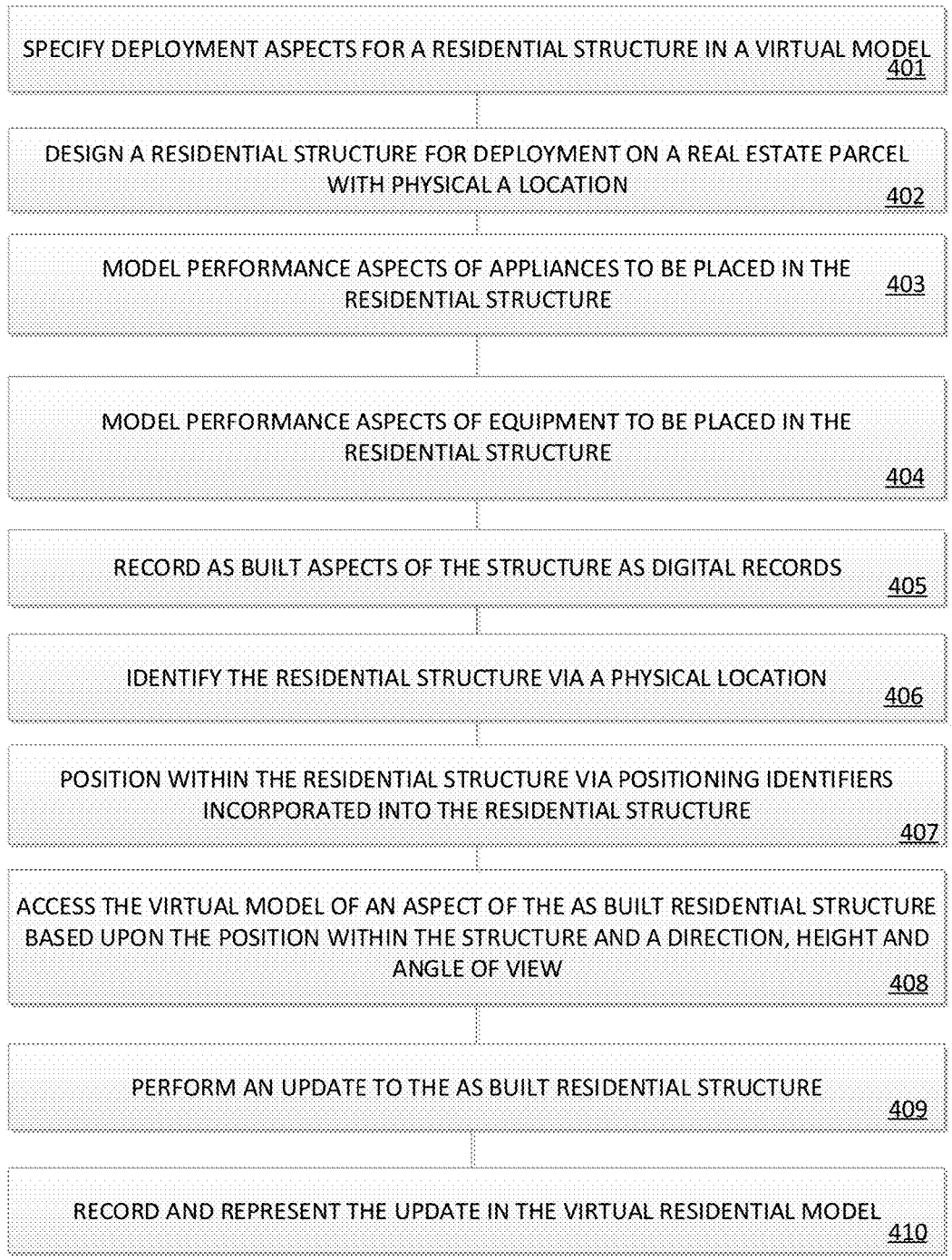
FIG. 4A, 4B, 4C illustrates an exemplary method flow diagram for residential monitoring and maintenance.

Referring now to FIG. 4A, method steps that may be implemented in some embodiments of the present invention are illustrated. At method step 401, deployment aspects may be specified for a residential structure and incorporated into a virtual model, such as a Virtual Residential Model discussed above. Deployment aspects may include for example, a purpose for an as built structure that is built based of the Virtual Residential Model. The purpose may include, by way of non-limiting example, one or more of: being a home for an elderly person with limited mobility; being a home for a family with multiple grammar school or younger children; being a combined home/office for a professional; being a home for multiple generations, such as a mother/daughter home; and being a multifamily home. Deployment aspects may also include a level of use, such as year round, seasonal or vacation. A climate in which the structure will be placed may also be considered in the deployment aspects. Climate may include one or more of: four seasons; primarily winter; tropical, desert; exposed to salt air; and other environmental factors.

At method step 402, a virtual model, such as a Virtual Residential Model is digitally created according to the deployment aspects of the model. The Virtual Residential Model may include improvements to a real estate parcel and a structure that will be placed on the real estate parcel, as well as where a structure may be located upon the parcel.

At method step 403, Performance aspects of appliances that may be included in the Virtual Residential Model may be digitally modeled and may include a level of use of the appliances and an expected satisfaction of the appliance as deployed according to the deployment aspects. Maintenance expectations, including a number of repair calls and a preventive maintenance schedule may also be modeled and associated costs.

At method step 404, Performance aspects of equipment that may be included in the Virtual Residential Model may be digitally modeled and may include a level of use of the equipment and an expected satisfaction of the appliance as deployed according to the deployment aspects. Maintenance expectations, including a number of repair calls and a preventive maintenance schedule may also be modeled and associated costs.

At method step 405, as built aspects of a structure are recorded as discussed herein, preferably recordation of as built aspects begins as construction begins and continues throughout the existence of the structure.

At method step 406, the physical structure may be identified via a location. A physical location may include, for example, Cartesian Coordinates, such as Latitude and Longitude coordinates, GPS coordinates, or other verifiable set of location parameters. In addition, more exact location specifications may include survey designations.

At method step 407, a position within or proximate to the residential structure may be determined via positioning identifiers. The position within or proximate to the residential may be determined, for example as discussed with relation to FIG. 5 herein.

At method step 408 a Virtual Residential Model may be identified and accessed via the physical location. Once an appropriate Virtual Residential Model is accessed, a particular portion of the Virtual Residential Model may be presented via a GUI based upon the position within the residential structure (or proximate to the residential structure) and a direction, height and angle of view. The position may be determined relative to location identifiers. Height may be determined via electronic devices, such as a smart device, or via triangulation referencing the location identifiers (locations identifiers are discussed more fully above and below).

At method step 409 an update may be made to a physical residential structure and at method step 410, the update to the physical structure may be recorded and reflected in the Virtual Residential Model.

Figure 4B:
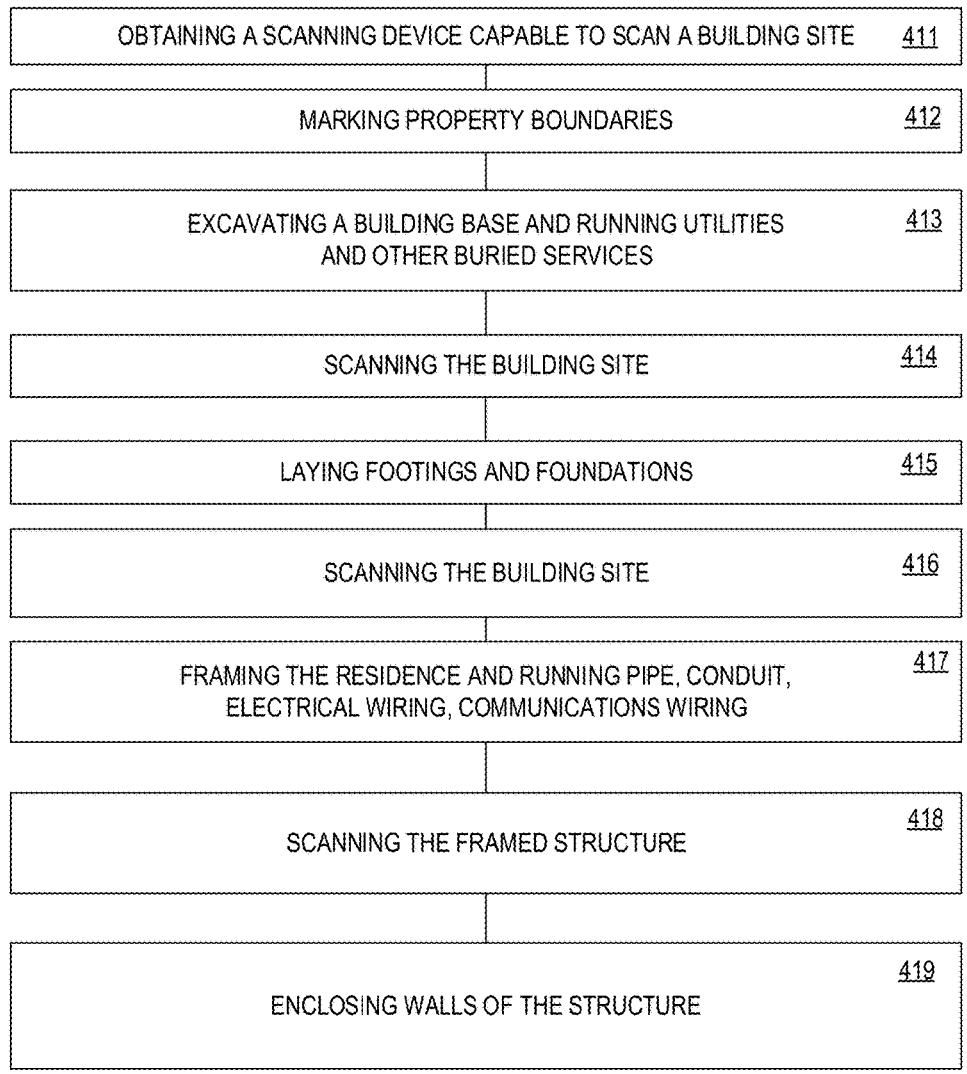

Referring to FIG. 4B, a method flow diagram for residential monitoring and maintenance is illustrated. At 411 a user may obtain a scanning device or devices that may scan a building site. At 412, the user or a service of the user may mark property boundaries of the residential site. At 413, work on the residential site may continue with the excavation of a building base and the laying down of utilities and other buried services. At 415, the scanning device is used to scan the location of the various aspects of the building site. At 416, work may continue with the laying of footings and foundations and other such foundational building activities. At 418, the building site may again be scanned to locate the various elements. The framing of the residence may commence along with running of pipe, wiring, conduits, ducts and various other items that are located within wall structures. Before coverings are placed on walls, the framed structure may be scanned at 418. Thereafter, the framed structure may be enclosed with walls 419.

Figure 4C:
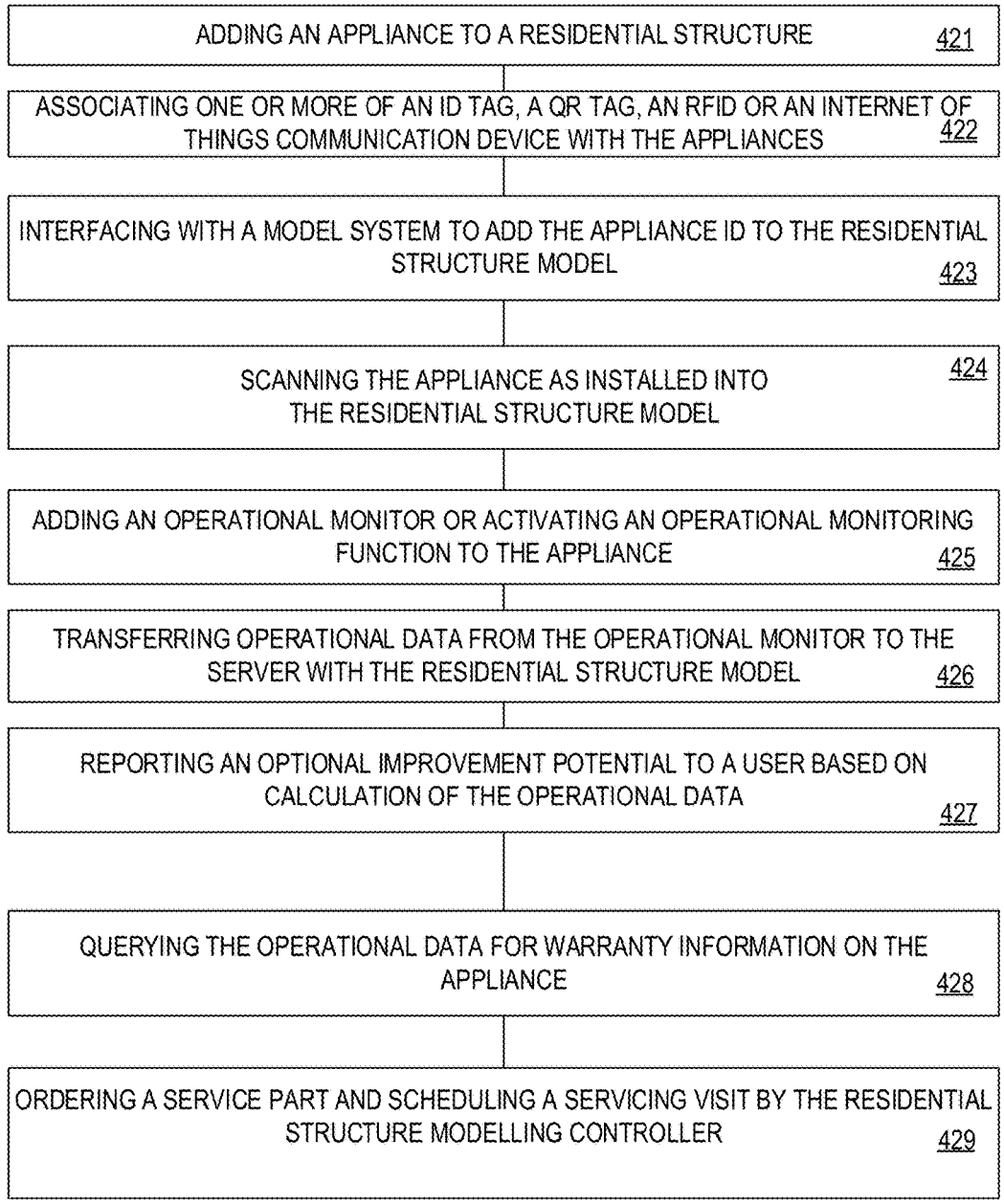

Referring to FIG. 4C a method flow diagram for residential monitoring and maintenance is illustrated. In this flow diagram, a residential structure may already be built and may have various data layers already located in the model system. At 421 an appliance may be added to the residential structure. At 422, an ID tag, or a QR tag, or and RFID tag or an internet of things device may be associated with the appliance and may be programmed into the model system. At 523, the model system may be interfaced to the appliance id and into the residential structure model. At 424, a scanning step may be used to input three dimensional structure data at the installed location into the model system. At 425, an operational monitor function of the device may be added or activated. At 426, operational data may be transferred from the operational monitor to the server with the residential structure model.

At 427, algorithms running on a server of the model system may determine an operational improvement opportunity based on calculations performed on the data from the operational monitor. At 428 a user may query the operational data of the appliance for information on its warranty. At 429, the model system may initiate an order for a service part and may schedule a service visit to make a repair based upon analysis of the operational data. The various steps outlined in the processing flow may be performed in different orders. In some examples additional steps may be performed. In some examples, some steps may not be performed.

In some embodiments, the present invention includes a method of tracking attainment of a stated Objective relating to a residential structure, including: a) determining a geographic position of a residential structure via a global positioning system device in a smart device proximate to the residential structure; b) identifying a digital model of the residential structure based upon the geographic position of the residential structure, the digital model comprising virtual representation of structural components included in the residential structure; c) referencing multiple positioning reference devices within the residential structure; d) measuring a distance to at least three of the multiple positioning reference devices from a point of measurement; e) calculating a position within the residential structure, the calculation based upon a relative distance of the at least three positioning reference devices to the point of measurement and a triangulation calculation; f) calculating an elevation of the point of measurement; g) measuring a first state within the residential structure with a sensor; h) specifying a location of the first state within the residential structure via reference to the position of the point of measurement and the elevation of the point of measurement; i) recording a first time designation for the step of measuring a first state within the residential structure with a sensor; and i) correlating the first state within the residential structure and the first time designation attainment of the stated Objective.

The geographic position may be calculated with a GPS reading from within the residential structure. Measuring a distance to the at least three of the positioning reference devices may include, one or more of: relative signal strength received from wireless transmissions emanating from the at least three positioning reference devices; time of arrival of radio signals of wireless transmissions emanating from the at least three positioning reference devices measuring a distance to the at least three positioning reference devices comprises time difference of arrival of radio signals of wireless transmissions emanating from the at least three reference positioning devices.

The above steps may be repeated for at least a second state and a second time designation, and in preferred embodiments multiple more states and time designations.

A state may include, for example, one or more of: a vibration measured with an accelerometer; a temperature of at least a portion of the structure; an electrical current measurement to equipment installed in the residential structure; a number of cycles of operation of equipment installed in the residential structure; a number of cycles of operation of an appliance installed in the residential structure; an electrical current measurement to an appliance installed in the residential structure; a vibration associated with movement of an occupant of the residential structure.

A vibration pattern may be associated with a specific occupant and tracking the movement of the specific occupant through the structure may be based upon measured vibration patterns. Similarly, a vibration pattern may be associated with a particular activity of a specific occupant and the activity of the specific occupant may be tracked within the structure based upon measured vibration patterns.

An Objective may include one or more of: operating the residential structure for a term of years within a threshold use of energy; operating the residential structure for a term of years within a threshold number of repairs; and operating the residential structure for a term of years within a threshold budgetary cost.

Figure 5:
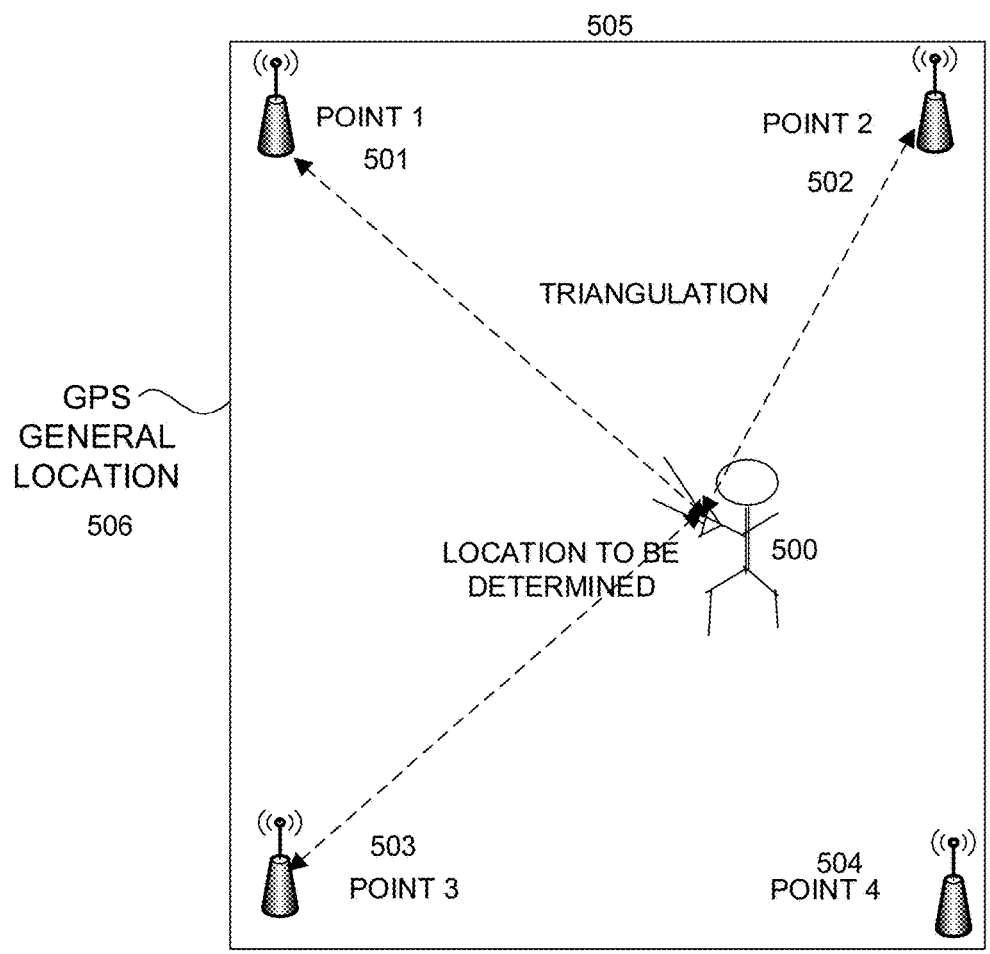
FIG. 5 illustrates location and positioning devices associated within a residential structure.

FIG. 5 illustrates location and positioning identifiers 501-504 that may be deployed in a residential structure according to some embodiments of the present invention to determine a user position 500 within or proximate to the residential structure 505. Positioning identifiers may include a device that is fixed in a certain location and may be used to determine via calculation a position of a user with a tablet, smart phone or other network access device able to recognize the position identifiers. The position identifiers 501-504 may include devices, such as, for example, a radio transmitter, a light beacon, or an image recognizable device. A radio transmitter may include a router or other WiFi device. In some embodiments, a position identifier may include a WiFi router that additionally provides access to a distributed network, such as the Internet. Cartesian Coordinates, such as a GPS position 506, may be utilized to locate and identify the residential structure 506.

A precise location may be determined via triangulation based upon a measured distance from three 501-503 or more position identifiers 501-504. For example a radio transmission or light signal may be measured and compared from the three reference position identifiers 501-503. Other embodiments may include a device recognizable via image analysis and a camera or other Image Capture Device, such as a CCD device, may capture an image of three or more position identifiers 501-504. Image analysis may recognize the identification of each of three or more of the position identifiers

501-504 and a size ratio of the respective image captured position identifiers 501-504 may be utilized to calculate a precise position. Similarly, a height designation may be made via triangulation using the position identifiers as reference to a known height or a reference height.

Figure 6:
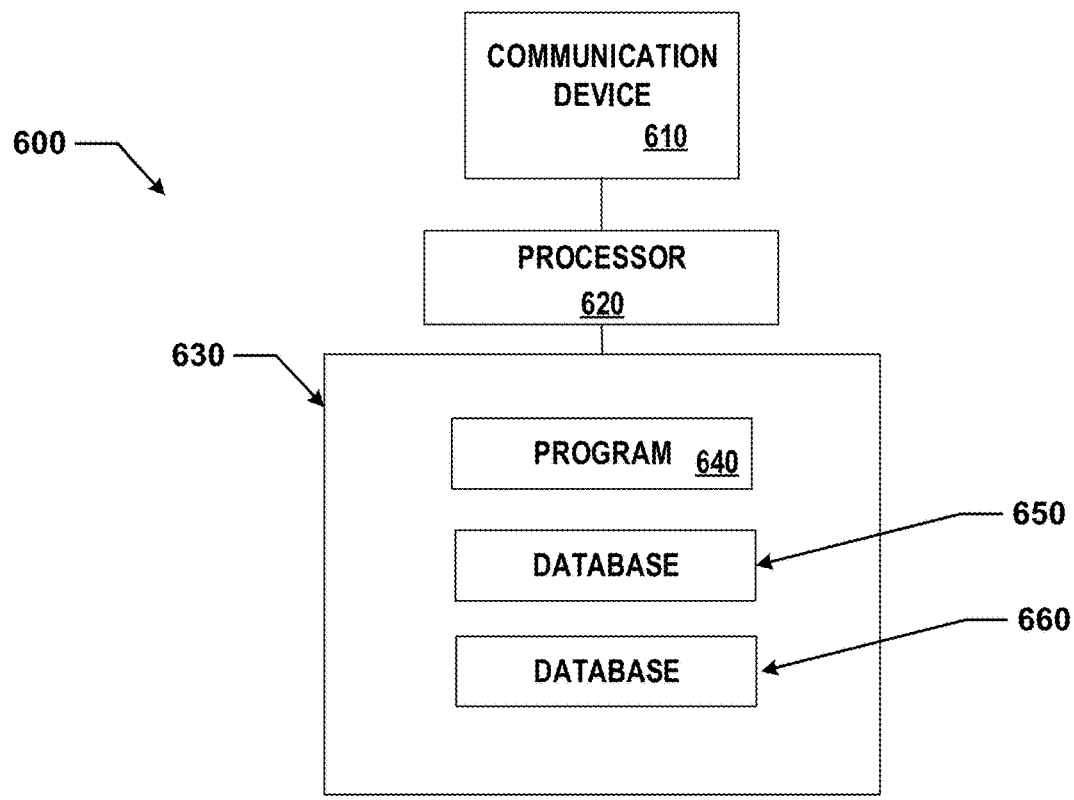
FIG. 6 illustrates apparatus that may be used to implement aspects of the present invention including executable software.

FIG. 6 illustrates an automated controller that may be used to implement various aspects of the present invention, in various embodiments, and for various aspects of the present invention, controller 600 may be included in one or more of: a wireless tablet or handheld device, a server, a rack mounted processor unit. The controller may be included in one or more of the apparatus described above, such as a Server, and a Network Access Device. The controller 600 comprises a processor unit 620, such as one or more semiconductor based processors, coupled to a communication device 610 configured to communicate via a communication network (not shown in FIG. 6). The communication device 610 may be used to communicate, for example, with one or more online devices, such as a personal computer, laptop, or a handheld device.

The processor 620 is also in communication with a storage device 630. The storage device 630 may comprise any appropriate information storage device, including combinations of magnetic storage devices (e.g., magnetic tape and hard disk drives), optical storage devices, and/or semiconductor memory devices such as Random Access Memory (RAM) devices and Read Only Memory (ROM) devices.

The storage device 630 can store a software program 640 with executable logic for controlling the processor 620. The processor 620 performs instructions of the software program 640, and thereby operates in accordance with the present invention. The processor 620 may also cause the communication device 610 to transmit information, including, in some instances, control commands to operate apparatus to implement the processes described above. The storage device 630 can additionally store related data in a database 650 and database 660, as needed.

Figure 7:
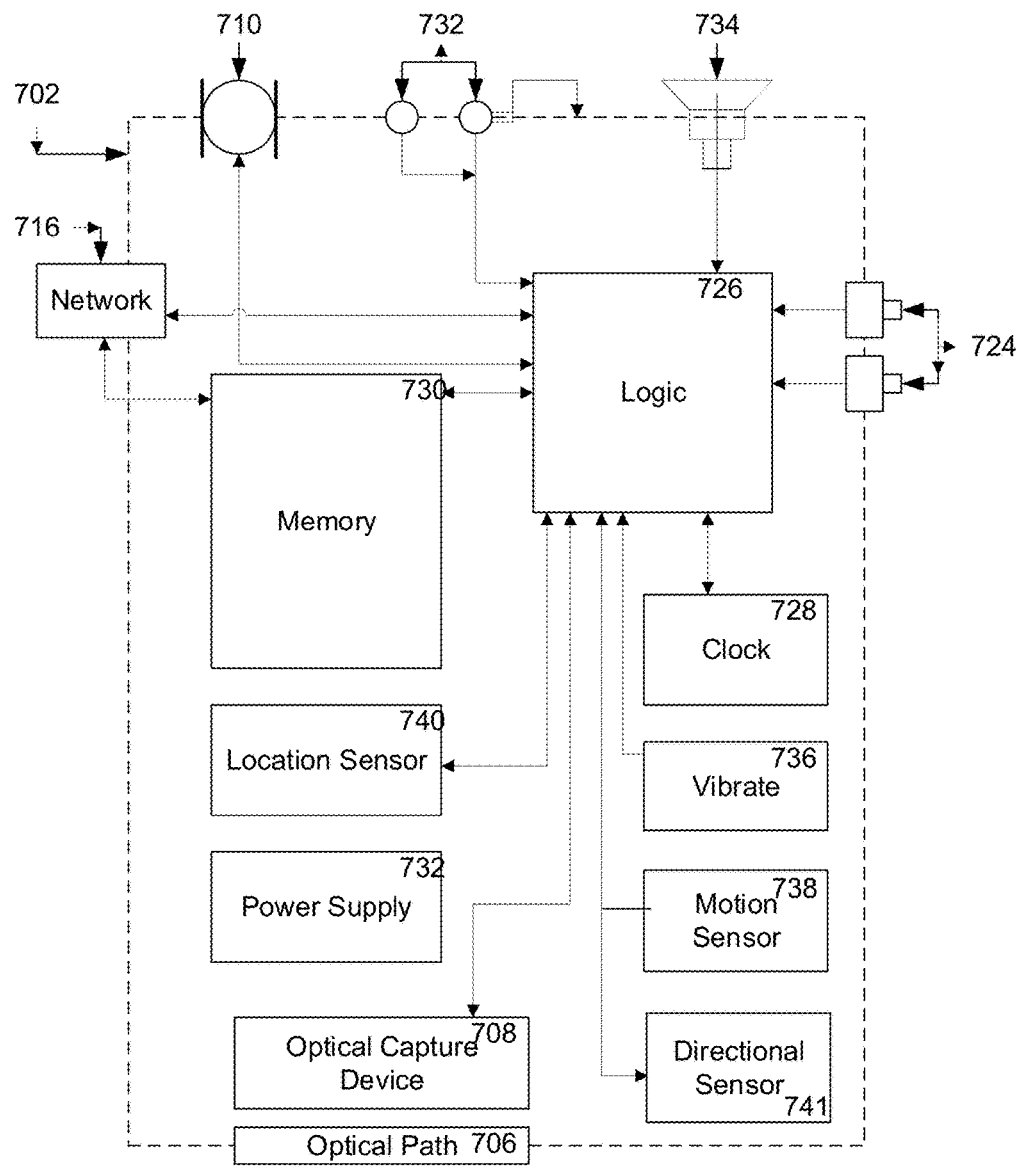
FIG. 7 illustrates an exemplary handheld device that may be used to implement aspects of the present invention including executable software.

Referring now to FIG. 7, a block diagram of an exemplary mobile device 702. The mobile device 702 comprises an optical capture device 708 to capture an image and convert it to machine-compatible data, and an optical path 706, typically a lens, an aperture or an image conduit to convey the image from the rendered document to the optical capture device 708. The optical capture device 708 may incorporate a Charge-Coupled Device (CCD), a Complementary Metal Oxide Semiconductor (CMOS) imaging device, or an optical Sensor of another type.

A microphone 710 and associated circuitry may convert the sound of the environment, including spoken words, into machine-compatible signals. Input facilities may exist in the form of buttons, scroll wheels, or other tactile Sensors such as touch-pads. In some embodiments, input facilities may include a touchscreen display.

Visual feedback to the user is possible through a visual display, touchscreen display, or indicator lights. Audible feedback 734 may come from a loudspeaker or other audio transducer. Tactile feedback may come from a vibrate module 736.

A motion Sensor 738 and associated circuitry convert the motion of the mobile device 702 into machine-compatible signals. The motion Sensor 738 may comprise an accelerometer that may be used to sense measurable physical acceleration, orientation, vibration, and other movements. In some embodiments, motion Sensor 738 may include a gyroscope or other device to sense different motions.

A location Sensor 740 and associated circuitry may be used to determine the location of the device. The location Sensor 740 may detect Global Position System (GPS) radio signals from satellites or may also use assisted GPS where the mobile device may use a cellular network to decrease the time necessary to determine location. In some embodiments, the location Sensor 740 may use radio waves to determine the distance from known radio sources such as cellular towers to determine the location of the mobile device 702. In some embodiments these radio signals may be used in addition to GPS.

The mobile device 702 comprises logic 726 to interact with the various other components, possibly processing the received signals into different formats and/or interpretations. Logic 726 may be operable to read and write data and program instructions stored in associated storage or memory 730 such as RAM, ROM, flash, or other suitable memory. It may read a time signal from the clock unit 728. In some embodiments, the mobile device 702 may have an on-board power supply 732. In other embodiments, the mobile device 702 may be powered from a tethered connection to another device, such as a Universal Serial Bus (USB) connection.

The mobile device 702 also includes a network interface 716 to communicate data to a network and/or an associated computing device. Network interface 716 may provide two-way data communication. For example, network interface 716 may operate according to the internet protocol. As another example, network interface 716 may be a local area network (LAN) card allowing a data communication connection to a compatible LAN. As another example, network interface 716 may be a cellular antenna and associated circuitry which may allow the mobile device to communicate over standard wireless data communication networks. In some implementations, network interface 716 may include a Universal Serial Bus (USB) to supply power or transmit data. In some embodiments other wireless links may also be implemented.

As an example of one use of mobile device 702, a reader may scan some coded information from a location marker in a facility with the mobile device 702. The coded information may include for example a hash code, bar code, RFID or other data storage device. In some embodiments, the scan may include a bit-mapped image via the optical capture device 708. Logic 726 causes the bit-mapped image to be stored in memory 730 with an associated time-stamp read from the clock unit 728. Logic 726 may also perform optical character recognition (OCR) or other post-scan processing on the bit-mapped image to convert it to text. Logic 726 may optionally extract a signature from the image, for example by performing a convolution-like process to locate repeating occurrences of characters, symbols or objects, and determine the distance or number of other characters, symbols, or objects between these repeated elements. The reader may then upload the bit-mapped image (or text or other signature, if post-scan processing has been performed by logic 726) to an associated computer via network interface 716.

As an example of another use of mobile device 702, a reader may capture some text from an article as an audio file by using microphone 710 as an acoustic capture port. Logic 726 causes audio file to be stored in memory 730. Logic 726 may also perform voice recognition or other post-scan processing on the audio file to convert it to text. As above, the reader may then upload the audio file (or text produced by post-scan processing performed by logic 726) to an associated computer via network interface 716.

A directional sensor 741 may also be incorporated into the mobile device 702. The directional device may be a compass and be based upon a magnetic reading, or based upon network settings.

In the following sections, detailed descriptions of examples and methods of the invention will be given. The description of both preferred and alternative examples though through are exemplary only, and it is understood that to those skilled in the art that variations, modifications and alterations may be apparent. It is therefore to be understood that the examples do not limit the broadness of the aspects of the underlying invention as defined by the claims.

Additional examples may include Sensor arrays, audio capture arrays and camera arrays with multiple data collection angles that may be complete 360 degree camera arrays or directional arrays, for example, in some examples, a Sensor array (including image capture Sensors) may include at least 120 degrees of data capture, additional examples include a Sensor array with at least 180 degrees of image capture; and still other examples include a Sensor array with at least 270 degrees of image capture. In various examples, data capture may include Sensors arranged to capture image data in directions that are planar or oblique in relation to one another.

By way of non-limiting example, functions of the methods and apparatus presented herein may include one or more of the following factors that may be modeled and/or tracked over a defined period of time, such as, for example, an expected life of a build (i.e. 10 years or 20 years).

Particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order show, or sequential order, to achieve desirable results. In certain implementations, multitasking and parallel processing may be advantageous. Nevertheless, it will be understood that various modifications may be made without departing from the spirit and scope of the claimed invention.

What is claimed is:

1. A method of tracking a state of a physical as built feature of a residential structure in a CAD Virtual Model, the method comprising;
   a) determining a geographic position of a physical residential structure via a global positioning system device in a smart device held by a User proximate to or within the residential structure;
   b) identifying a digital virtual model of the residential structure based upon the geographic position of the residential structure, the digital model comprising the CAD virtual Model of structural components included in the residential structure;
   c) referencing multiple positioning reference devices within the residential structure;
   d) measuring a distance from the smart device at a first point of measurement to at least three of the multiple positioning reference devices;
   e) specifying a first position of a smart device held by a User at a Vantage Point within the residential structure, the first position based upon first respective distances of the at least three positioning reference devices to the first position of the smart device and a triangulation calculation;
   f) calculating an elevation of the smart device at the first position;
   g) specifying a direction of an as built feature via the User positioned at the Vantage Point extending the smart device from the first position comprising a base position to a second position comprising an extended position;
   h) measuring a distance from the smart device at the second position to the at least three of the multiple positioning reference devices;
   i) specifying a second position within the residential structure, based upon second respective distances of the at least three positioning reference devices to the second position of the smart device;
   j) measuring a first state of the as built feature with the smart device at one of: the first position and the second position along the direction of the as built feature specified by movement of the smart device from the first position to the second position with a sensor controlled by the smart device;
   k) specifying a location of the first state within the residential structure via reference to the position of the first point of measurement, the elevation of the first point of measurement and a distance in the direction of the as built feature;
   l) recording a time designation for the step of measuring a first state of the as built feature with the smart device within the residential structure;
   m) generating a virtual representation of the as built feature within the CAD virtual model;
   n) displaying the virtual representation of the physical as built feature on a display based upon a query input by the User.

2. The method of claim 1, wherein the geographic position is calculated with a GPS reading from within the residential structure and the elevation of the first point of measurement is equivalent to the second point of measurement.

3. The method of claim 2 wherein the step of measuring a distance to the at least three of the positioning reference devices comprises determination of a relative signal strength received from wireless transmissions emanating from the at least three positioning reference devices.

4. The method of claim 2 additionally wherein the step of measuring a distance to the at least three positioning reference devices comprises determination of a time of arrival of radio signals of wireless transmissions emanating from the at least three positioning reference devices.

5. The method of claim 1 wherein the step of measuring a distance to the at least three positioning reference devices comprises time difference of arrival of radio signals of wireless transmissions emanating from the at least three positioning reference devices.

6. The method of claim 5 additionally comprising repeating steps a) through m) for a second state of the same as built feature captured at a second time designation.

7. The method of claim 6, wherein at least one of the first state and second state within the residential structure comprises a vibration measured with an accelerometer.

8. The method of claim 6 wherein at least one of the first state and second state within the residential structure comprises a temperature of at least a portion of the structure measured via an infrared temperature profile device.

9. The method of claim 6 wherein at least one of the first state and second state within the residential structure comprises an electrical current measurement of power provided to equipment installed in the residential structure.

10. The method of claim 6 wherein at least one of the first state and second state within the residential structure comprises a number of cycles of operation of equipment installed in the residential structure.

11. The method of claim 6 wherein at least one of the first state and second state within the residential structure comprises a number of cycles of operation of an appliance installed in the residential structure.

12. The method of claim 6 wherein at least one of the first state and second state within the residential structure comprises an image data of the as built feature in the residential structure.

13. The method of claim 6, wherein at least one of the first state and second state within the residential structure comprises a vibration associated with movement of an occupant of the residential structure.

14. The method of claim 13, additionally comprising the steps of: associating a vibration pattern with a specific occupant and tracking the movement of the specific occupant through the structure based upon measured vibration patterns.

15. The method of claim 13, additionally comprising the steps of: associating a vibration pattern with a particular activity of a specific occupant and tracking the activity of the specific occupant within the structure based upon measured vibration patterns.

16. The method of claim 6 wherein the state within the residential structure comprises a heat sensor scan of a portion of the residential structure.

17. The method of claim 16 wherein the state within the heat sensor scan of the portion of the residential structure comprises an infrared scan.

18. The method of claim 6 further comprising operating the residential structure for a term of years within a threshold use of energy.

19. The method of claim 6 further comprising operating the residential structure for a term of years within a threshold number of repairs.

20. The method of claim 6 further comprising operating the residential structure for a term of years within a threshold budgetary cost.

* * * * *